US008822255B2

(12) United States Patent
Yamamoto et al.

(10) Patent No.: US 8,822,255 B2
(45) Date of Patent: Sep. 2, 2014

(54) METHOD OF MANUFACTURING A SOLAR CELL MODULE AND APPARATUS OF MANUFACTURING A SOLAR CELL MODULE

(75) Inventors: Yoshiaki Yamamoto, Chigasaki (JP); Hitoshi Ikeda, Chigasaki (JP); Tomoki Ohnishi, Chigasaki (JP); Kouichi Tamagawa, Chigasaki (JP)

(73) Assignee: Ulvac, Inc., Kanagawa (JP)

( * ) Notice: Subject to any disclaimer, the term of this patent is extended or adjusted under 35 U.S.C. 154(b) by 99 days.

(21) Appl. No.: 13/393,654

(22) PCT Filed: Aug. 30, 2010

(86) PCT No.: PCT/JP2010/005333
§ 371 (c)(1),
(2), (4) Date: Jun. 4, 2012

(87) PCT Pub. No.: WO2011/027532
PCT Pub. Date: Mar. 10, 2011

(65) Prior Publication Data
US 2012/0238048 A1    Sep. 20, 2012

(30) Foreign Application Priority Data

Sep. 4, 2009    (JP) ................................. 2009-205323

(51) Int. Cl.
    *H01L 31/18*    (2006.01)
(52) U.S. Cl.
    USPC ............... 438/57; 438/799; 438/795; 438/16; 438/80; 438/79; 257/291; 257/73; 257/E31.11; 257/E21.525; 257/E21.347; 257/E21.599; 257/E31.032; 250/453.11
(58) Field of Classification Search
    CPC .................. H01L 27/1423; H01L 31/022425; H01L 27/14689; H01L 27/14643; H01L 27/14609; H01L 31/1804; H01L 31/18; Y02E 10/50; B23K 26/36; B23K 26/409
    USPC .......... 136/252; 438/57, 799, 795, 16, 80, 79; 257/E31.11, E21.333, E21.599, 257/E31.032, E31.126, E21.347, E21.09; 250/453.11
    See application file for complete search history.

(56) References Cited

U.S. PATENT DOCUMENTS

2006/0266409 A1    11/2006    Takeda et al.
2007/0284345 A1*   12/2007    Ando et al. .............. 219/121.67

FOREIGN PATENT DOCUMENTS

| JP | S63-202077 A  | 8/1988  |
| JP | 2006-332453 A | 12/2006 |
| JP | 2008-066453 A | 3/2008  |
| JP | 2010-021361 A | 1/2010  |

OTHER PUBLICATIONS

International Search Report from the International Bureau of WIPO for International Application No. PCT/JP2010/005333 dated Nov. 30, 2010 (1 page) and an English translation of the same (1 page).

* cited by examiner

*Primary Examiner* — Jerome Jackson, Jr.
*Assistant Examiner* — Bo Fan
(74) *Attorney, Agent, or Firm* — Fitch, Even, Tabin & Flannery, LLP

(57) ABSTRACT

A method of manufacturing a solar cell, which includes an edge deletion step using a laser beam, and a manufacturing apparatus which is used in such a method, the method and the apparatus being capable of preventing a shunt and cracks from being generated are provided. By radiating a first laser beam to a multilayer body, which includes a transparent electrode layer, a photoelectric conversion layer, and a back electrode layer sequentially formed on a transparent substrate, from a side of the transparent substrate, the photoelectric conversion layer and the back electrode layer in a first region are removed, and by radiating a second laser beam into the region such that the second laser beam is spaced from a peripheral rim of the region, the transparent electrode layer in a second region is removed.

6 Claims, 10 Drawing Sheets

METHOD OF MANUFACTURING A SOLAR CELL MODULE AND APPARATUS OF MANUFACTURING A SOLAR CELL MODULE

CROSS-REFERENCE TO A RELATED APPLICATIONS

This application is a U.S. national phase application filed under 35 U.S.C. §371 of International Application PCT/JP2010/005333, filed on Aug. 30, 2010, designating the United States, which claims priority from JP 2009-205323, filed on Sep. 4, 2009, which are hereby incorporated herein by reference in their entirety.

TECHNICAL FIELD

The present invention relates to a method of manufacturing a solar cell module, which includes an edge deletion step, and to an apparatus of manufacturing a solar cell module, which is used in such a method.

BACKGROUND ART

The solar cell consists of a solar cell module obtained by forming on a single substrate a plurality of solar cells each being a minimum unit for performing photovoltaic power generation. Here, as one of manufacturing steps for a solar cell module, there is a step called "edge deletion." The manufacturing steps for a solar cell module generally include a step of uniformly forming on a substrate made of a glass or the like thin films including a transparent electrode layer, a photoelectric conversion layer, a back electrode layer, and the like. Here, in the case where thin films are present on a peripheral rim portion (portion having a width from a peripheral rim) of the substrate, a short circuit of the thin films and a metal frame or the like attached to the peripheral rim portion may occur or moisture and the like may infiltrate the peripheral rim portion, resulting in low power generation performance. Therefore, after forming the thin films, edge deletion being a step of removing the thin films present on the peripheral rim portion of the substrate is needed.

For the edge deletion, there is, for example, a method of using sandblasting. In the sandblasting, by spraying powdered abrasives to the thin films on the peripheral rim portion using gas so as to physically remove the thin films. However, in the sandblasting, there are problems in that the powdered abrasives are dispersed also in a power generation region, resulting in low power generation performance, a great amount of dust is generated, and so on. Although other than the sandblasting, there are various methods including directly grinding with a rotating grinder, etching with chemicals, and the like, they have problems in terms of productivity and the like. In view of this, in recent years, edge deletion using a laser beam is considered.

For example, Japanese Patent Application Laid-open No. 2008-66453 (paragraph [0056], FIG. 7B) discloses a method of manufacturing a solar cell module using a laser. In such a manufacturing method, the laser is used to remove, from a transparent conductive layer, a photoelectric conversion layer, and a back electrode layer, which have been sequentially stacked on a translucent substrate, the back electrode layer and the photoelectric conversion layer so that a burr prevention groove is formed. Next, by using a laser to remove the transparent conductive layer, the photoelectric conversion layer, and the back electrode layer in an outside of the burr prevention groove (peripheral region), a peripheral rim isolation groove is formed. At this time, the laser is radiated so that an end portion of a laser beam pattern overlaps with the burr prevention groove and a center portion of the laser beam pattern reaches the outside of the burr prevention groove. By forming the peripheral rim isolation groove in this manner, a short circuit (shunt) between the back electrode layer and the transparent electrode layer, which occurs due to residues of the transparent conductive layer that adhere to the walls of the groove, is prevented from being generated.

However, in the method of manufacturing a solar cell module using a laser, which is described in Japanese Patent Application Laid-open No. 2008-66453 (paragraph [0056], FIG. 7B), when the peripheral rim isolation groove is formed, the transparent conductive layer, the photoelectric conversion layer, and the back electrode layer are all removed in the center portion of the laser beam pattern. Here, when the transparent conductive layer, the photoelectric conversion layer, and the back electrode layer are all removed, there is a fear that cracks are generated in a portion of the translucent substrate, which is irradiated with the laser beam, because the laser radiated from the translucent substrate side is reflected by the back electrode layer and heat is accumulated therein. The cracks contribute to a change of the outer appearance of the manufactured solar cell. In addition, the cracks can cause damage and low quality of the solar cell panel, and particularly low power generation performance due to infiltration of moisture and the like over time, and so on.

SUMMARY OF THE INVENTION

In view of the above-mentioned circumstances, it is an object of the present invention to provide a method of manufacturing a solar cell, which includes an edge deletion step using a laser beam, and an apparatus of manufacturing a solar cell module, which is used in such a method, the method and the apparatus being capable of preventing a shunt and cracks from being generated.

In order to achieve the above-mentioned object, a method of manufacturing a solar cell module according to an aspect of the present invention includes radiating a first laser beam to a multilayer body, which includes a transparent substrate and a transparent electrode layer, a photoelectric conversion layer, and a back electrode layer sequentially formed on the transparent substrate, from a side of the transparent substrate, to thereby remove the photoelectric conversion layer and the back electrode layer in a first region irradiated with the first laser beam.

The transparent electrode layer in the second region irradiated with the second laser beam is removed by radiating a second laser beam having a property different from a property of the first laser beam into the first region such that the second laser beam is spaced from a peripheral rim of the first region.

In order to achieve the above-mentioned object, an apparatus of manufacturing a solar cell module according to an aspect of the present invention is an apparatus of manufacturing a solar cell module, that radiates a laser beam to a multilayer body including a transparent substrate and a transparent electrode layer, a photoelectric conversion layer, and a back electrode layer sequentially formed on the transparent substrate, and includes a laser beam oscillator, an output controller, a stage, and a position controller.

The laser beam oscillator generates a laser beam having a wavelength included in an infrared wavelength region.

The output controller forms, in order to remove the photoelectric conversion layer and the back electrode layer, a first laser beam by controlling an output of the laser beam and forms, in order to remove the transparent electrode layer, a second laser beam having an output larger than an output of the first laser beam by controlling the output of the laser beam.

On the stage, the multilayer body is disposed.

The position controller controls a relative position between the laser beam oscillator and the stage such that a first region includes a second region and a peripheral rim of the second region is spaced from a peripheral rim of the first region, the first region being a region in which the formed photoelectric conversion layer and the formed back electrode layer are removed by irradiating the multilayer body with the first laser, the second region being a region in which the formed transparent electrode layer is removed by irradiating the multilayer body with the second laser beam.

DETAILED DESCRIPTION OF THE PREFERRED EMBODIMENTS

Figure 1:
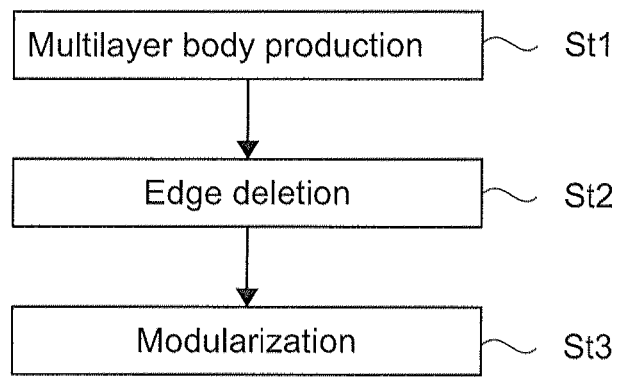
FIG. 1 is a flowchart showing a method of manufacturing a solar cell module according to a first embodiment.

A method of manufacturing a solar cell module according to an embodiment of the present invention includes radiating a first laser beam to a multilayer body, which includes a transparent substrate and a transparent electrode layer, a photoelectric conversion layer, and a back electrode layer sequentially formed on the transparent substrate, from a side of the transparent substrate, to thereby remove the photoelectric conversion layer and the back electrode layer in a first region irradiated with the first laser beam.

The transparent electrode layer in the second region irradiated with the second laser beam is removed by radiating a second laser beam having a property different from a property of the first laser beam into the first region such that the second laser beam is spaced from a peripheral rim of the first region.

The first laser beam removes the back electrode layer and the photoelectric conversion layer of the multilayer body and the second laser beam removes the transparent electrode layer not including the back electrode layer and the photoelectric conversion layer above it. By setting the property (wavelength or energy density) of the first laser beam to be different from the property of the second laser beam, it is possible that the first laser beam does not remove the transparent electrode layer and the second laser beam removes the transparent electrode layer. The first laser beam does not remove the transparent electrode layer, and hence in irradiation of the first laser beam, no cracks are generated in the transparent substrate. Further, when the second laser beam removes the transparent electrode layer, the photoelectric conversion layer and the back electrode layer have been removed, and hence the second laser beam is not reflected by the back electrode layer and cracks are prevented from being generated in the transparent substrate due to heat accumulation. In addition, by radiating the second laser beam into the first region such that the second laser beam is spaced from the peripheral rim of the first region, end surfaces of the photoelectric conversion layer and the back electrode layer, which have been formed due to the irradiation of the first laser beam, are spaced from a position in which the transparent electrode layer is removed by the second laser beam. Accordingly, when the transparent conductive layer is removed, it is possible to prevent the back electrode layer from being molten due to heat or a short circuit (shunt) between the back electrode layer and the transparent conductive layer, which occurs due to residues of the transparent conductive layer that adhere to the end surface, is prevented from being generated.

The first laser beam and the second laser beam may have the same wavelength included in an infrared wavelength region, and the second laser beam may be radiated to have an energy density higher than an energy density of the first laser beam.

The transparent electrode layer of the multilayer body exhibits a low absorptance with respect to a laser beam having an infrared wavelength. Therefore, by adjusting the energy density of a laser beam, whether or not to remove the transparent electrode layer can be selected. By setting the energy density of the first laser beam to be sufficiently low, that is, to be below a laser ablation threshold, it becomes possible to prevent the transparent electrode layer from being removed. In contrast, by setting the energy density of the second laser beam to be sufficiently high (even if most of the second laser beam passes through the transparent electrode layer), it is possible to remove the transparent electrode layer by laser ablation. Therefore, by adjusting the energy density of a laser having an infrared wavelength, a first laser and a second laser can be obtained. Accordingly, the laser beam irradiation apparatus to be used in edge deletion as a feature of the present invention needs only to include a laser beam generator capable of outputting a single infrared laser beam. Thus, the laser beam irradiation apparatus can be simplified. Further, an infrared laser beam generator is generally cheaper than a harmonic laser beam generator, and hence it is also possible to reduce the cost for the laser beam irradiation apparatus.

The first laser beam may have a wavelength included in a green light wavelength region, and the second laser beam may have a wavelength included in an infrared wavelength region.

The absorptance of the transparent electrode layer of the multilayer body with respect to a laser beam having a green light wavelength region is significantly smaller than the absorptance of the transparent electrode layer of the multilayer body with respect to a laser beam having an infrared wavelength. Therefore, by setting the laser beam having a green light wavelength region as the first laser beam, irrespective of the energy density, without removing the transparent electrode layer, the photoelectric conversion layer and the back electrode layer can be removed. Further, by setting the laser having an infrared wavelength as the second laser beam so as to set its energy density to be sufficiently high, the transparent electrode layer can be removed.

The second laser beam may be radiated to the multilayer body from the side of the transparent substrate.

During irradiation of the second laser beam, the irradiated region thereof is included in the first region and the back electrode layer that reflects the laser beam is not present, and hence the second laser beam is not limited to be radiated from the side of the transparent substrate of the multilayer body and can also be radiated from the opposite side. However, in the case where the second laser beam is radiated from the side of the transparent substrate, it is possible to use the same optical system as the first laser beam. Thus, in this case, the laser beam irradiation apparatus which is used in edge deletion can be simplified. Further, dispersion of removed films with respect to the optical system is prevented by the transparent substrate, and hence contamination of the optical system can be prevented.

The second region may include an end portion of the multilayer body.

The transparent electrode layer, the photoelectric conversion layer, and the back electrode layer in the end portion of the multilayer body are all removed. Thus, in the subsequent step, a sealant can be directly applied to the transparent substrate and the adhesion property in sealing can be improved. Therefore, a solar cell module more excellent in moisture resistance and weather resistance can be manufactured.

An apparatus of manufacturing a solar cell module according to an embodiment of the present invention is an apparatus of manufacturing a solar cell module, that radiates a laser beam to a multilayer body including a transparent substrate and a transparent electrode layer, a photoelectric conversion layer, and a back electrode layer sequentially formed on the transparent substrate, and includes a laser beam oscillator, an output controller, a stage, and a position controller.

The laser beam oscillator generates a laser beam having a wavelength included in an infrared wavelength region.

The output controller forms, in order to remove the photoelectric conversion layer and the back electrode layer, a first laser beam by controlling an output of the laser beam and forms, in order to remove the transparent electrode layer, a second laser beam having an output larger than an output of the first laser beam by controlling the output of the laser beam.

On the stage, the multilayer body is disposed.

The position controller controls a relative position between the laser beam oscillator and the stage such that a first region includes a second region and a peripheral rim of the second region is spaced from a peripheral rim of the first region, the first region being a region in which the formed photoelectric conversion layer and the formed back electrode layer are removed by irradiating the multilayer body with the first laser, the second region being a region in which the formed transparent electrode layer is removed by irradiating the multilayer body with the second laser beam.

The output controller controls the output of the laser beam, and hence a single optical system can be used. In addition, without changing a laser spot area in an irradiated surface and the moving speed of the stage, infrared laser beams having different energy densities, that is, the first laser beam and the second laser beam can be formed. Further, The position controller controls the laser spot position such that the first region in which the photoelectric conversion layer and the back electrode layer of the multilayer body have been removed by the first laser beam includes the second region in which the transparent electrode layer is removed by the second laser beam and that the peripheral rim of the second region is spaced from the peripheral rim of the first region. Accordingly, cracks and a shunt in the transparent substrate can be prevented from being generated.

Hereinafter, with reference to the drawings, embodiments of the present invention will be described.

First Embodiment

A first embodiment of the present invention will be described.

FIG. 1 is a flowchart showing a method of manufacturing a solar cell module according to the first embodiment. As shown in the drawing, the method of manufacturing a solar cell module according to this embodiment includes a multilayer body producing step (St1), an edge deletion step (St2), and a modularization step (St3). It should be noted that the method of manufacturing a solar cell according to this embodiment may include steps other than those steps. In the following, each of the steps will be described.

[Multilayer Body Producing Step (St1)]

The multilayer body producing step (St1) will be described.

Figure 2:
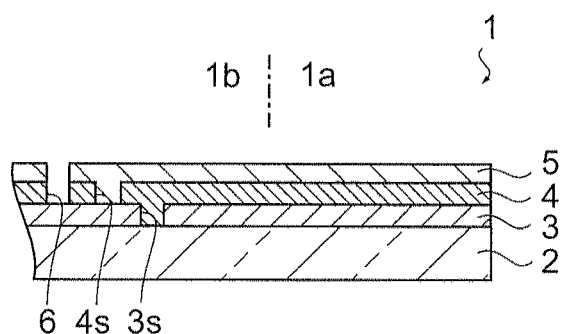
FIG. 2 is a sectional view showing a structure of a multilayer body produced in a multilayer body producing step.
Figure 3:
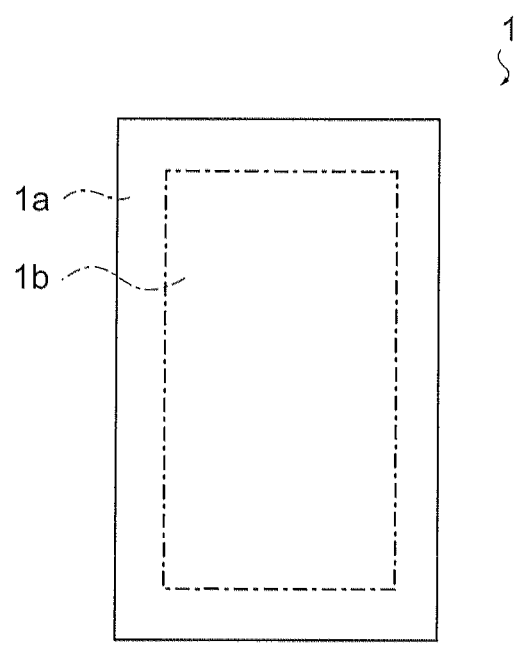
FIG. 3 is a plan view showing the multilayer body produced in the multilayer body producing step.

FIG. 2 is a sectional view showing a multilayer body 1 produced in this step. FIG. 3 is a plan view showing the multilayer body 1.

The multilayer body 1 is formed by stacking a transparent electrode layer 3, a photoelectric conversion layer 4, and a back electrode layer 5 on a transparent substrate 2. The transparent substrate 2 is made of, for example, a white plate glass (glass from which Fe components are removed) that has a size of 1 m *1 m and 5 mm in thickness. It should be noted that in addition to this, the transparent substrate 2 may be made of various glasses such as a blue plate glass (glass from which Fe components are not removed), a borosilicate glass, a soda-lime glass, an alkali-free glass, a silica glass, and a lead glass, a synthetic resin, and the like and the size thereof is not limited thereto.

First, the transparent electrode layer 3 is stacked. The transparent electrode layer 3 can be formed by forming on the transparent substrate 2 an $SnO_2$ thin film having a thickness of 1 μm by a thermal CVD (Chemical Vapor Deposition) method. Other than $SnO_2$, the transparent electrode layer 3 can be made of a conductive material having a high light transmittance, such as a transparent conductive oxide (TCO) including ZnO and ITO (Indium Tin Oxide). In addition, the thickness thereof can be appropriately changed. The film formation method is also not limited to the thermal CVD method, and a sputtering method, applying, or the like may be employed.

Next, the transparent electrode layer 3 is separated. By irradiating the transparent electrode layer 3 with an infrared laser beam (wavelength: 1,064 nm) using an Nd:YAG (Yttrium Aluminum Garnet) as a laser crystal, the transparent electrode layer 3 is linearly removed (laser scribing) to thereby form a separation line 3s. Regarding the separation line 3s, a plurality of separation lines 3s can be formed to be arranged in parallel in one direction. The wavelength and output of the laser beam may be appropriately selected, and the laser beam may be a continuous wave. The separation of the transparent electrode layer 3 is performed for the purpose of connecting currents in series, the currents being generated by the photoelectric conversion layer 4 that will be described later. Regarding the separation line 3s, for example, a plurality of separation lines 3s are formed to be arranged in parallel in one direction. The method for the separation of the transparent electrode layer 3 is not limited to the laser scribing and other methods may be employed. Further, the separation of the transparent electrode layer 3 may be performed after another layer is formed on the transparent electrode layer 3.

Next, the photoelectric conversion layer 4 is stacked. The photoelectric conversion layer 4 can be formed by sequentially forming, on the transparent electrode layer 3 by a plasma CVD method, a B-doped amorphous Si film (p-layer) having a thickness of 30 nm, an amorphous Si film (i-layer) having a thickness of 300 nm, and a P-doped microcrystalline Si (n-layer) having a thickness of 30 nm. It is sufficient for the photoelectric conversion layer 4 to have a structure allowing photoelectric conversion. Therefore, other than the above-mentioned structure, the photoelectric conversion layer 4 may have a structure of repeating pin junction, that is, a tandem type structure of pin/pin, a triple type structure of pin/pin/pin, or the like. Further, for example, a middle layer such as a buffer layer arranged between the p-layer and the i-layer or a TCO layer adjusting an optical refraction index may be included. The film formation method is also not limited to the plasma CVD method.

Next, the photoelectric conversion layer 4 is separated. By irradiating the photoelectric conversion layer 4 with a second harmonic green laser beam using an Nd:YAG as a laser crystal, the photoelectric conversion layer 4 is linearly removed, to thereby form a separation line 4s. The wavelength and output of the laser beam may be appropriately selected, and the laser beam may be a continuous wave. The separation of the photoelectric conversion layer 4 is performed for the purpose of connecting the back electrode layer 5, which will be described later, to the transparent electrode layer 3. Regarding the separation line 4s, for example, a plurality of separation lines 4s are formed to be arranged in parallel to the separation line 3s at positions different from the positions at which the separation lines 3s are arranged. The method for the separation of the photoelectric conversion layer 4 is not limited to the laser scribing, and other methods can be employed. Further, the separation of the photoelectric conversion layer 4 may be performed after another layer is formed on the photoelectric conversion layer 4.

Next, the back electrode layer 5 is stacked. The back electrode layer 5 can be formed by forming, on the photoelectric conversion layer 4 by a sputtering method, Ag having a thickness of 300 nm. Alternatively, the back electrode layer 5 may be made of a conductive material capable of reflecting a beam that has passed through the photoelectric conversion layer 4, such as Al, Cr, Mo, W, or Ti, and the thickness thereof can be appropriately changed. The film formation method is also not limited to the sputtering method, and a CVD method, an application method, or the like may be employed.

Next, the photoelectric conversion layer 4 and the back electrode layer 5 are separated. By irradiating the photoelectric conversion layer 4 and the back electrode layer 5 with an infrared laser beam (wavelength: 1,064 nm) using an Nd:YAG as a laser crystal or a second harmonic green laser beam (wavelength: 532 nm) using an Nd:YAG as a laser crystal, the photoelectric conversion layer 4 and the back electrode layer 5 are linearly removed, to thereby form a cell separation line 6.

Regarding the cell separation line 6, a plurality of cell separation lines 6 can be formed to be arranged in parallel in one direction. The wavelength and output of the laser beam may appropriately selected, and the laser beam may be continuous wave.

Regarding the cell separation line 6, a plurality of cell separation lines 6 are formed at positions different from the positions, at which the separation line 3s and the separation line 4s are arranged, in parallel to the separation line 3s and the separation line 4s. The laser beam is input from the transparent substrate 2 side to be prevented from being reflected by the back electrode layer 5. By forming the cell separation line 6, a current generated in the photoelectric conversion layer 4 is allowed to flow through the transparent electrode layer 3 and the back electrode layer 5 into the adjacent photoelectric conversion layer 4, and the cell is separated. The method for the separation of the photoelectric conversion layer 4 and the back electrode layer 5 is not limited to the laser scribing, and other methods may be employed.

In the above-mentioned manner, the multilayer body 1 shown in FIGS. 2 and 3 is formed. It should be noted that the method of producing the multilayer body 1 is not limited to the above-mentioned method and can be appropriately changed. Further, the multilayer body 1 may include layers other than the above-mentioned layers. As shown in FIG. 3, a portion having a certain width from the peripheral rim of the multilayer body 1 is referred to as a peripheral rim portion 1a, and a portion other than the peripheral rim portion 1a of the multilayer body 1 is referred to as a power generation portion 1b contributing to power generation.

[Edge Deletion Step (St2)]

The edge deletion step is a step of removing the transparent electrode layer 3, the photoelectric conversion layer 4, and the back electrode layer 5, which are present on the peripheral rim portion 1a of the multilayer body 1. With this step, it becomes possible to prevent a short circuit of those layers and a metal frame or the like attached to the peripheral rim portion 1a in modularization step (St3), which will be described later, from occurring, or moisture and the like from infiltrating through the peripheral rim portion 1a after they are completed as a solar cell module.

In the edge deletion step described in the following, first, by irradiating the peripheral rim portion 1a with a first laser beam L1, a first region A1 (FIG. 4) in which the photoelectric conversion layer 4 and the back electrode layer 5 are removed is formed. Next, by irradiating the first region A1 with the second laser beam L2, a second region A2 (FIG. 5) in which the transparent electrode layer 3 is removed is formed. In the edge deletion step of this embodiment, a case where the first laser beam L1 and the second laser beam L2 have the same wavelength will be described.

The irradiation of the multilayer body 1 with the first laser beam L1 will be described.

Figure 4:
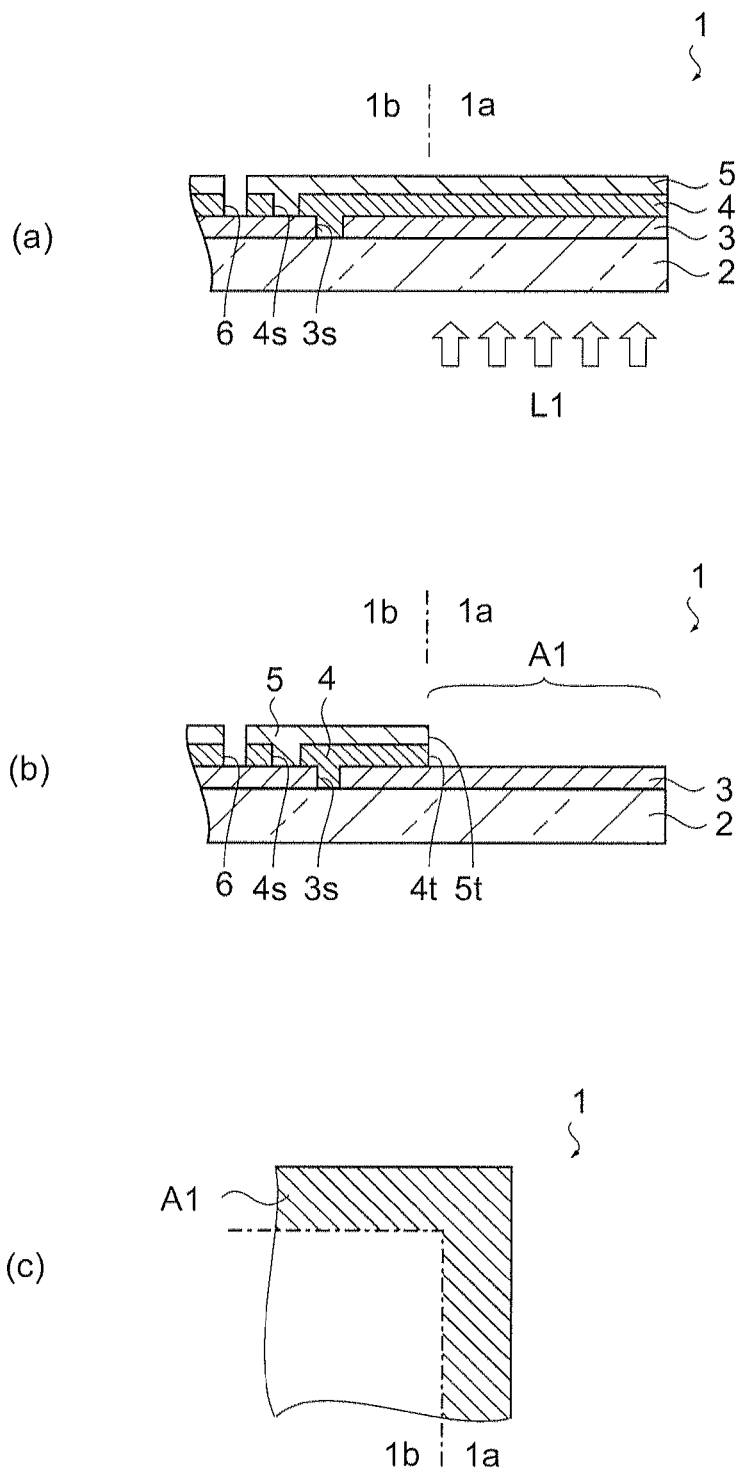
FIGS. 4(a)-4(c) are views for illustrating a first laser beam being radiated in an edge deletion step.

FIG. 4 is views for illustrating the first laser beam L1 being radiated.

As shown in FIG. 4(a), the peripheral rim portion 1a of the multilayer body 1 is irradiated with a first laser beam L1 from the transparent substrate 2 side. The first laser beam L1 is radiated to a predetermined range by scanning a laser spot shaped in a predetermined size and moving a relative position of the multilayer body 1 with respect to an irradiation position of the laser beam.

The first laser beam L1 passes through the transparent electrode layer 3 and is absorbed by the photoelectric conversion layer 4. As a result, the photoelectric conversion layer 4 is removed, and the back electrode layer 5 being a layer above it is also removed. The transparent electrode layer 3 remains without being removed. Thus, as shown in FIG. 4(b), on the first region A1 being the region irradiated with the first laser beam L1, the transparent electrode layer 3 is exposed. Further, the photoelectric conversion layer 4 and the back electrode layer 5 are, in the first region A1, removed, and hence an end surface 4t of the photoelectric conversion layer 4 and an end surface 5t of the back electrode layer 5 are newly formed. FIG. 4(c) is a plan view showing the range of the first region A1 irradiated with the first laser beam L1.

The first laser beam L1 may be a laser beam (infrared laser beam) having a wavelength included in an infrared wavelength region. Although a little of the infrared laser beam is absorbed by the transparent electrode layer 3, most of the infrared laser beam passes through the transparent electrode layer 3, arrives at the photoelectric conversion layer 4, and is absorbed by the photoelectric conversion layer 4. Therefore, by setting the first laser beam L1 to have a suitable energy density, without subjecting the transparent electrode layer 3 to laser ablation, only the photoelectric conversion layer 4 can be subjected to laser ablation. Further, as described above, typically, the photoelectric conversion layer 4 is stacked by a CVD method or the like, while the back electrode layer 5 is stacked by a sputtering method or the like. Therefore, the adhesion property of the photoelectric conversion layer 4 with respect to the transparent electrode layer 3 is smaller than the adhesion property of the back electrode layer 5 with respect to the photoelectric conversion layer 4. Consequently, it is quite possible to selectively remove the transparent electrode layer 3, the photoelectric conversion layer 4, and the back electrode layer 5.

Specifically, as the first laser beam L1, an infrared laser beam having a wavelength of 1,064 nm using an Nd:YAG crystal as a laser crystal may be used. The wavelength of the first laser beam L1 may be selected from an infrared wavelength region (700 nm to 2,500 nm) exhibiting a low optical absorptance with respect to the transparent electrode layer 3 and a high optical absorptance with respect to the photoelectric conversion layer 4, depending on the materials for the transparent electrode layer 3 and the photoelectric conversion layer 4. For such a laser beam, there are solid laser beams using Er:YAG (wavelength of 2940 nm), Ho:YAG (wavelength of 2,098 nm), Yb:YAG (wavelength of 1,030 nm), Nd:YVO$_4$ (wavelength of 1,064, 1,342 nm), Nd:GdVO$_4$ (wavelength of 1,063 nm), Ti-sapphire (wavelength of 700 to 1,000 nm), and the like as a laser crystal. In addition to them, a gas laser beam or a semi-conductor laser beam may be used as the first laser beam L1. Further, the laser beam may be pulsed or a continuous wave.

The energy density of the first laser beam L1 is appropriately selected within such a range that the photoelectric conversion layer 4 and the back electrode layer 5 can be removed without removing the transparent electrode layer 3, although the transmittance of the transparent electrode layer 3 and the absorptance of the photoelectric conversion layer 4 are varied depending on the wavelength of the laser beam. For example, in the case of an infrared laser beam having a wavelength of 1,064 nm, its energy density can be set to range from 0.5 to 1.5 J/cm$^2$.

It should be noted that the energy density of the first laser beam L1 and the second laser beam L2 is a time integral value of a peak output density (W/cm$^2$) per unit area in an irradiated surface.

The transparent electrode layer 3 is not subjected to ablation using the first laser beam L1, and hence it is possible to prevent generation of cracks in the transparent substrate 2 in the phase where the first laser beam L1 is irradiated. Further, the end surface 4$t$ and the end surface 5$t$ that are newly formed due to the irradiation of the first laser beam L1 are insusceptible to thermal damage and contamination due to residues.

Irradiation of the multilayer body 1 with the second laser beam L2 will be described.

Figure 5:
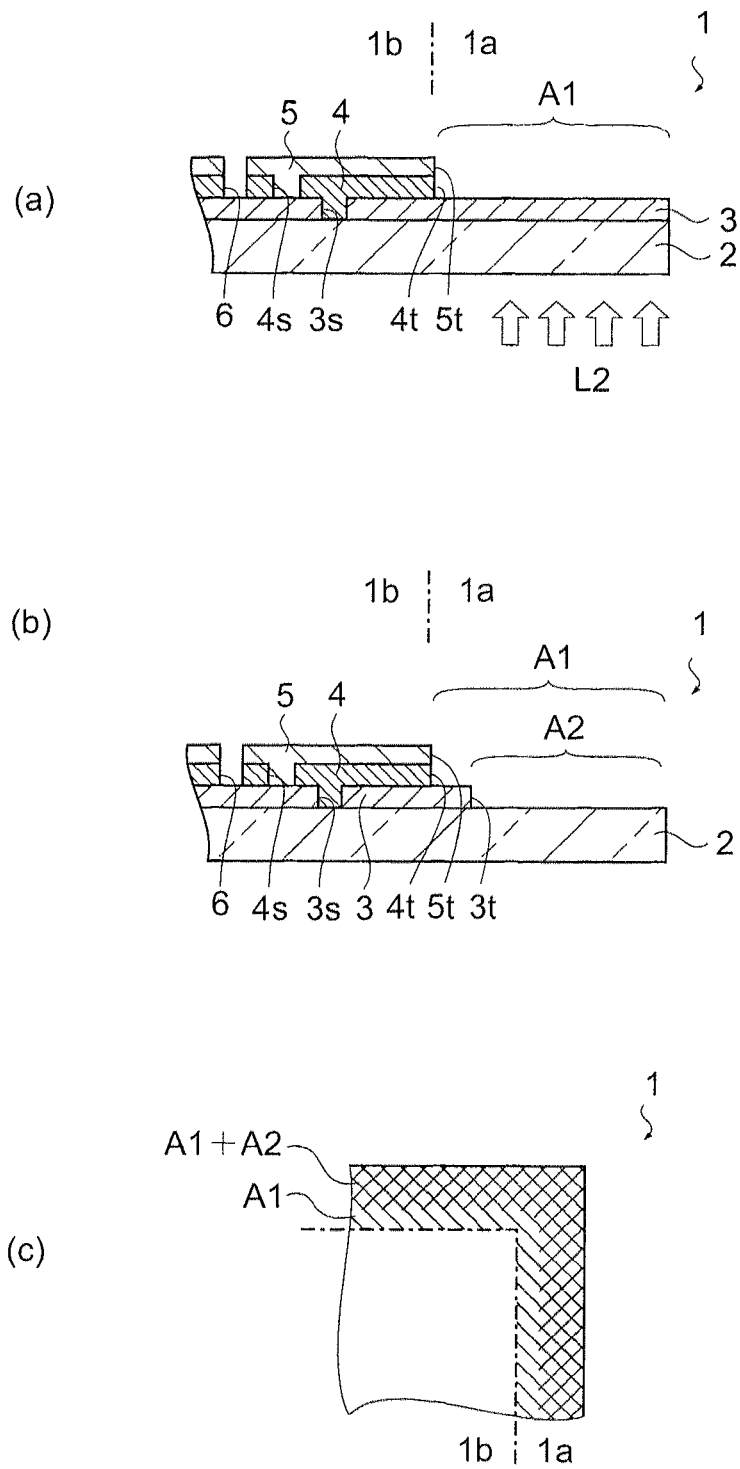
FIGS. 5(a)-5(c) are views for illustrating a second laser beam being radiated in the edge deletion step.

FIG. 5 is views for illustrating the second laser beam L2 being radiated.

As shown in FIG. 5($a$), the first region A1 is irradiated with the second laser beam L2. Similar to the first laser beam L1, the second laser beam L2 may be radiated from the transparent substrate 2 side. Alternatively, the back electrode layer 5 that reflects the laser beam has been removed, and hence the second laser beam L2 may be radiated from a side opposite to the transparent substrate 2 side. The second region A2 being the region irradiated with the second laser beam may be a region having a peripheral rim spaced from the peripheral rim of the first region A1. The second laser beam L2 is radiated to a predetermined range by scanning a laser spot shaped in a predetermined size and moving a relative position of the multilayer body 1 with respect to the irradiation position of the laser beam.

The second laser beam L2 is absorbed by the exposed transparent electrode layer 3 on the first region A1. As a result, the transparent electrode layer 3 is removed. Accordingly, as shown in FIG. 5($b$), on the second region A2 being the region irradiated with the second laser beam L2, the transparent substrate 2 is exposed, and an end surface 3$t$ of the transparent electrode layer 3 is newly formed after the transparent electrode layer 3 is removed on the second region A2. The position of the end surface 3$t$ is spaced from the positions of the end surface 4$t$ and the end surface 5$t$ that have been formed due to the irradiation of the first laser beam L1. FIG. 5($c$) is a plan view showing the range of the second region A2 irradiated with the second laser beam L2. The range of the second region A2 formed on the first region A1 is denoted by A1+A2.

The second laser beam L2 may be a laser having the same wavelength as the first laser beam L1. As described above, most of the infrared laser beam passes through the transparent electrode layer 3, but a little of the infrared laser beam is absorbed by the transparent electrode layer 3. Therefore, even if the second laser beam L2 have the same wavelength as the first laser beam L1, by setting the energy density of the second laser beam L2 to be sufficiently high, it is possible to apply to the transparent electrode layer 3 energy enough to remove the transparent electrode layer 3.

Specifically, the second laser beam L2 may be an infrared laser having a wavelength of 1,064 nm using an Nd:YAG crystal as a laser crystal. The second laser beam L2 may be one that has the same wavelength as the first laser beam L1 and an energy density higher than that of the first laser beam L1.

The energy density of the second laser beam L2 is appropriately selected within such a range that the transparent electrode layer 3 can be removed, although the absorptance of the transparent electrode layer 3 varies depending on the wavelength of the laser beam. For example, in the case of an infrared laser having a wavelength of 1,064 nm, its energy density may be 5 J/cm$^2$ or more. As the second laser beam L2, a laser beam having an output larger than that of the first laser beam L1 or a laser spot area smaller than that of the first laser beam L1 may be used. The second laser beam L2 is not limited to be pulsed and may be a continuous wave. Even if the first laser beam L1 is a continuous wave, the second laser beam L2 may be set to be pulsed.

During the irradiation of the second laser beam L2, the first region A1 does not include anymore the back electrode layer 5 (and the photoelectric conversion layer 4) that reflect the second laser beam L2 and contributes to accumulation of heat, and hence the accumulation of heat due to the irradiation of the second laser beam L2 does not occur, and generation of cracks in the transparent substrate 2 is prevented.

Further, by setting the second region A2 to be a region having a peripheral rim spaced from the first region A1, the end surface 4$t$ and the end surface 5$t$ that have been formed due to the first laser beam L1 are spaced from a position in which the transparent electrode layer 3 is to be removed. Accordingly, a shunt, which is generated due to the residues of the transparent electrode layer 3 removed by the second laser beam L2 that adhere to the end surfaces of the back electrode layer 5 and the photoelectric conversion layer 4, can be prevented.

As described above, in the edge deletion of this embodiment, by using the first laser beam L1 to remove the photoelectric conversion layer 4 and the back electrode layer 5 and the second laser beam L2 to remove the transparent electrode layer 3, it is possible to reduce heat to be applied to the transparent substrate 2 and to prevent generation of cracks. Further, the end surfaces 4t and 5t formed due to the first laser beam L1 and the end surface 3t formed due to the second laser beam L2 can be suppressed from being molten, adhesion of the residues of those end surfaces can be suppressed, and a shunt can be prevented. In addition, the first laser beam L1 and the second laser beam L2 have the same infrared wavelength, and hence a single laser beam generator for generating the first laser beam L1 and the second laser beam L2 may be used.

As described above, the multilayer body 1 is subjected to edge deletion.

A laser beam irradiation apparatus 10 to be used in the edge deletion step (St2) will be described.

Figure 6:
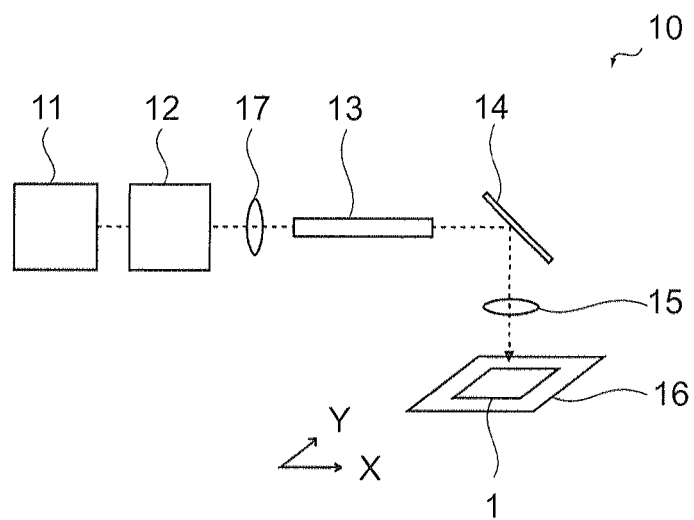
FIG. 6 is a view showing a schematic configuration of a laser beam irradiation apparatus according to the first embodiment.

FIG. 6 is a view showing a schematic configuration of the laser beam irradiation apparatus 10.

As shown in the drawing, the laser beam irradiation apparatus 10 includes an oscillator 11, a variable attenuator 12, a condenser lens 17, a homogenizer 13, a scanner 14, an fθ lens 15, and a stage 16. In the laser beam irradiation apparatus 10, the oscillator 11, the condenser lens 17, the homogenizer 13, the scanner 14, and the fθ lens 15 correspond to a laser beam oscillator. The variable attenuator 12 corresponds to an output controller. The configuration of the laser beam irradiation apparatus 10 is not limited to the configuration as described in the following.

The oscillator 11 outputs an infrared laser which becomes the first laser beam L1 and the second laser beam L2. The oscillator 11 installs a laser crystal such as an Nd:YAG laser rod (not shown), a laser diode for photo-excitation, or the like. The oscillator 11 may include a mechanical or electrochemical Q-switch mechanism for pulsed oscillation. By setting the first laser beam L1 and the second laser beam L2 to be infrared laser beams having the same wavelength, the oscillator 11 can be configured to be capable of outputting a single infrared laser beam.

The variable attenuator 12 attenuates the infrared laser beam output from the oscillator 11, to thereby control the output. As the variable attenuator 12, a Fresnel-reflection-type variable attenuator or a beam-split-type variable attenuator may be used. The beam-split-type variable attenuator is used when the laser beam is a linear polarized beam and consists of a λ/2 wave plate and a polarizing beam splitter. The λ/2 wave plate rotates the direction of polarization of a laser beam and the polarizing beam splitter separates the laser beam into a p-polarized beam and an s-polarized beam for attenuation. The Fresnel-reflection-type variable attenuator is used when the laser beam is non-polarized beam and consisting of a mirror with reflective coating and a compensator (optical axis compensating plate) with anti-reflective coating. By changing the angle of the reflective mirror, the transmittance of an incident laser beam is changed for attenuation.

The condenser lens 17 collects the laser beam output from the variable attenuator 12, to the homogenizer 13. The homogenizer 13 converts the shape of a cross-section of beam of the incident laser to obtain an even light intensity distribution. The laser beam irradiation apparatus 10 includes an optical fiber having a 0.6 mm square-shaped cross-section as the homogenizer 13. The homogenizer 13 converts the incident infrared laser beam into a laser having a square-shaped cross-section having an even light intensity distribution. The configuration of the homogenizer 13 is not limited thereto and a refraction-type homogenizer (micro lens array, aspheric lens, etc) or a reflection-type homogenizer (light pipe, aspheric mirror, etc) may be used.

The scanner 14 scans the laser beam by changing the direction of the reflected laser beam. As the scanner 14, it is possible to select one of various scanners such as a polygon scanner consisting of a rotating polyhedral mirror, a galvano scanner consisting of a mirror vibrating due to the external magnetic field, and a resonant scanner consisting of a mirror vibrating due to oscillation.

The fθ lens 15 corrects the scanning speed and the laser spot shape of the laser beam scanned by the scanner 14. Regarding the laser beam scanned by the scanner 14, although the scanning speed and the laser spot shape thereof when the laser beam is radiated to an irradiation target (multilayer body 1) are varied depending on the angle of reflection thereof, the fθ lens 15 can correct this.

The stage 16 defines an irradiation position of the laser beam with respect to the multilayer body 1. The stage 16 is configured to be movable in an X-direction being one direction parallel to a surface (laser-irradiated surface) of the multilayer body 1 and a Y-direction orthogonal to the X-direction. The stage 16 freely allows a laser beam to be radiated onto an X-Y plane. The laser beam irradiation apparatus 10 includes a position controller (not shown) that controls the movement of the stage 16.

One example of edge deletion performed by the laser beam irradiation apparatus 10 configured as described above will be described.

When the multilayer body 1 is disposed on the stage 16, the stage 16 moves to adjust the position of the multilayer body 1 so that any point on the peripheral rim portion 1a of the multilayer body 1 can be irradiated with a laser beam. The oscillator 11 outputs an infrared laser beam having a wavelength of 1,064 nm and a predetermined output and the variable attenuator 12 controls the output. The laser beam is converted by the homogenizer 13 to have a 0.6 mm square-shaped laser cross-section and made to even.

The laser beam is scanned by the scanner 14, corrected through the fθ lens 15, and radiated to the above-mentioned point of the multilayer body 1. Further, using the area of its laser spot, the output density is defined. The stage 16 moves and thus the laser beam is radiated to a predetermined range. Using the moving speed of the stage 16, the repeat frequency of the laser beam is defined. Here, the laser beam is adjusted to be a laser beam (the first laser beam L1) having such an energy density that the transparent electrode layer 3 is not removed and the photoelectric conversion layer 4 and the back electrode layer 5 are removed. By the position controller controlling the movement of the stage 16, the first region A1 being the region irradiated with the first laser beam L1 is formed within the peripheral rim portion 1a.

Next, by moving the stage 16, the position of the multilayer body 1 is adjusted so that any point on the first region A1 is irradiated with the laser beam. The variable attenuator 12 changes the output, and the moving speed of the stage 16 defines the repeat frequency of the laser beam. The laser beam is adjusted to be a laser beam (second laser beam L2) having such an energy density that the transparent electrode layer 3 is removed. By the position controller controlling the movement of the stage 16, the second region A2 being the region irradiated with the second laser beam within the first region A1 is formed.

The position controller may control the movement of the stage 16 such that the peripheral rim of the second region A2 is spaced from the peripheral rim of the first region A1. In this case, the areas of the first region A1 and the second region A2 can be reduced, and hence a laser beam scan time can be reduced, which contributes to an improvement of throughput. Alternatively, in the case where the first region portion extends up to the end of the multilayer body 1, that is, in the case where the first region A1 includes the end portion of the multilayer body 1, the second region A2 may also include the same end portion of the multilayer body 1. In this case, the layers in the end portion of the multilayer body 1 are all removed, and hence in the subsequent step, a sealant for the substrate can be directly applied to the multilayer body 1 and the adhesion property in sealing can be improved. Thus, a solar cell panel more excellent in moisture resistance and weather resistance can be manufactured.

Figure 7:
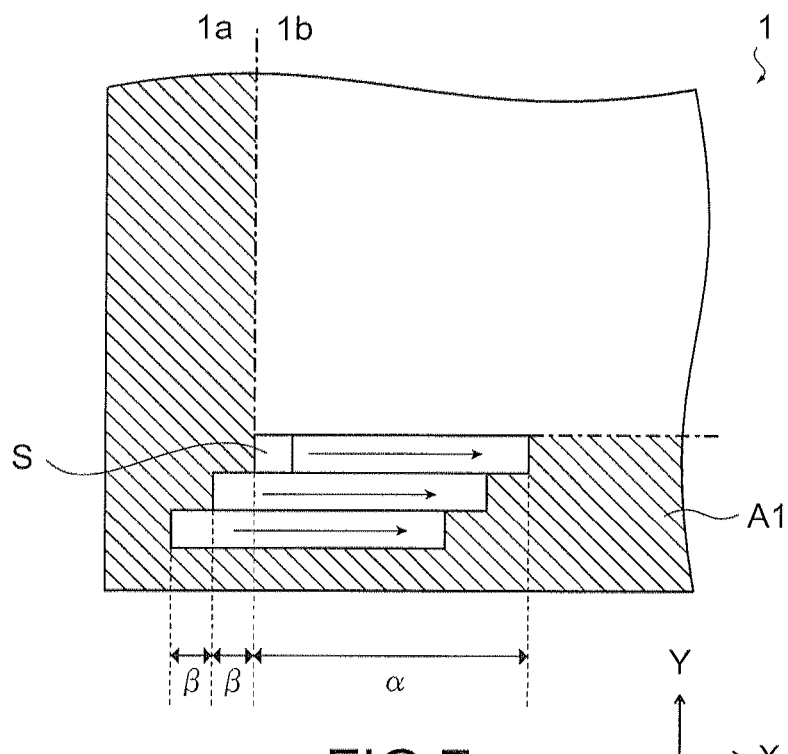
FIG. 7 is a view showing irradiation positions of laser beams which are controlled by a position controller.

FIG. 7 is a view showing irradiation positions of laser beams, which are controlled by the position controller.

For example, when performing edge deletion on one side of the multilayer body 1, the position controller uses the scanner 14 to scan the first laser beam L1 on an end portion of the first region A1 on a center side of the multilayer body 1 by a predetermined distance a from a scan start position S in an X-axis direction. When one scan is completed, the position controller moves the scan start position by a predetermined distance β in the X-axis direction. After that, the scanner 14 moves an irradiation position of the first laser beam L1 by a distance equal to the width of the laser beam in an opposite direction to the center side of the substrate in a Y-axis direction. Thus, in the subsequent scan, the scanner 14 scans, in the X-axis direction again by a predetermined distance α from a position deviated by a predetermined distance β from the scan start position S in the X-axis direction and deviated by a distance equal to the width in the Y-axis direction of the laser beam from the scan start position S in the Y-axis direction. By repeating the process, when in the Y-axis direction, irradiations in a predetermined range are completed, the position controller moves the scan start position of the laser beam L1 by a predetermined distance a and a distance equal to the width in the X-axis direction of the laser beam from the above-mentioned scan start position S in the X-axis direction.

As described above, while using the scanner 14 and the position controller, the stage 16 is moved such that the irradiation position of the first laser beam L1 goes around the power generation portion 1b. In other words, the first laser beam L1 is radiated to scan over the range of the region A1. Further, the stage 16 can be moved while using a scan by the scanner 14 and the position controller such that similar to the first laser beam L1, the second laser beam L2 goes around a portion which is located on the outer peripheral side of the multilayer body 1 in the region A1 and which is in contact with the outer periphery in order to form the region A2. In this manner, edge deletion of the multilayer body 1 can be performed.

As described above, as the laser beam output from the oscillator 11, the infrared laser beam is used, and hence by adjusting the energy density, the first laser beam L1 and the second laser beam L2 can be formed and the laser beam irradiation apparatus including a single-laser beam generator may be used.

[Modularization Step (St3)]

Figure 8:
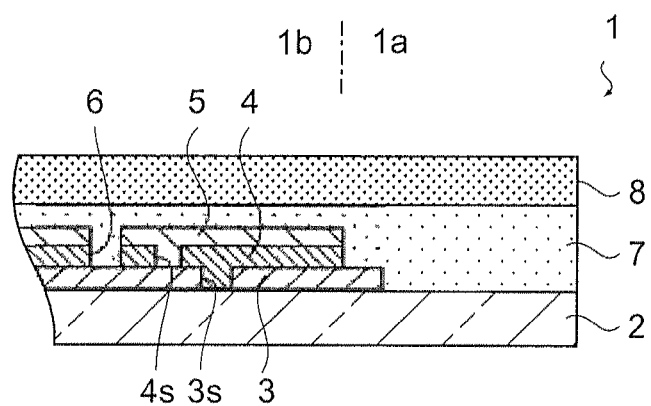
FIG. 8 is a sectional view showing the multilayer body modularized in a modularization step.

FIG. 8 is a view showing the multilayer body 1 modularized in the modularization step.

The modularization step St3 is a step of completing the multilayer body 1 as the solar cell module. It should be noted that before this step, a step of cleaning the multilayer body 1 may be adopted. With the method of manufacturing a solar cell module according to this embodiment, unlike the case where the sandblasting is used, the powdered abrasives and the like are not generated, and hence the step of cleaning the multilayer body 1 may be omitted.

To the multilayer body 1, wires (not shown) to be connected to each of the transparent electrode layer 3 and the back electrode layer 5 are attached. The wires can be formed, for example, by methods such as reflow with a soldering paste, sealing with a conductive adhesion, and plating.

Next, on the back electrode layer 5, an insulating layer 7 made of an insulating resin is formed. The insulating resin can be made of, for example, EVA (Ethylene Vinyl Acetate Copolymer). Next, on the insulating layer 7, a protective layer 8 made of a material excellent in moisture resistance is formed. The protective layer 8 can be made of PET (Polyethylene Terephthalate), Al, and PET which are sequentially stacked. The insulating layer 7 and the protective layer 8 can be formed by covering the back electrode layer 5 side of the multilayer body 1 with a EVA sheet and a PET/Al/PET sheet and laminating it under decreased pressure. Next, a frame (not shown) is attached onto the protective layer 8 and thus the multilayer body 1 is modularized. Such a modularization step is merely one example and the present invention is not limited thereto.

As described above, the solar cell module is manufactured.

With the method of manufacturing a solar cell module according to this embodiment, in the edge deletion step St2, the transparent electrode layer 3, the photoelectric conversion layer 4, and the back electrode layer 5 in the peripheral rim portion 1a are removed, and hence the frame and these layers can be surely insulated. Further, the peripheral rims of the transparent substrate 2, the insulating layer 7, and the protective layer 8 are spaced from the transparent electrode layer 3, the photoelectric conversion layer 4, and the back electrode layer 5, and hence it is possible to prevent moisture and the like from infiltrating through the peripheral rims of the transparent substrate 2, the insulating layer 7, and the protective layer 8, resulting in low power generation performance.

Second Embodiment

A second embodiment of the present invention will be described.

Description of the same content as that of the first embodiment will be omitted.

A method of manufacturing a solar cell module according to this embodiment includes a multilayer body producing step (St1), an edge deletion step (St2), and a modularization step (St3). The multilayer body producing step (St1) and the modularization step (St3) are the same as in the method of manufacturing a solar cell module according to the first embodiment, and hence the description thereof will be omitted.

[Edge Deletion Step (St2)]

The edge deletion step of the second embodiment is different from the edge deletion step of the first embodiment in that the first laser beam L1 and the second laser beam L2 have different frequencies.

The first laser beam L1 can be a laser beam (green laser beam) having a wavelength included in a green light wavelength region. The green laser beam passes through the transparent electrode layer 3, arrives at the photoelectric conversion layer 4, and is absorbed by the photoelectric conversion layer 4. The transmittance of the green laser beam with respect to the transparent electrode layer 3 is significantly larger than the transmittance of the infrared laser beam with respect to the transparent electrode layer 3. Therefore, by setting the first laser beam L1 to be the green laser beam, without removing the transparent electrode layer 3, only the photoelectric conversion layer 4 can be removed. Further, as described above, typically, the photoelectric conversion layer 4 is stacked by a CVD method or the like, while the back electrode layer 5 is stacked by a sputtering method or the like. Therefore, the adhesion property of the photoelectric conversion layer 4 with respect to the transparent electrode layer 3 is larger than the adhesion property of the back electrode layer 5 with respect to the photoelectric conversion layer 4. Consequently, by setting the first laser beam L1 to be the green laser beam, it is quite possible to remove the photoelectric conversion layer 4 and the back electrode layer 5 without removing the transparent electrode layer 3.

Specifically, as the first laser beam L1, a green laser beam being a second harmonic wave (wavelength 532 nm) using an Nd:YAG crystal as a laser crystal may be used. The wavelength of the first laser beam L1 may be selected from the green light wavelength region (500 nm to 570 nm) exhibiting a high transmittance with respect to the transparent electrode layer 3, depending on the materials for the transparent electrode layer 3 and the photoelectric conversion layer 4. For such a laser beam, there are, for example, solid-state laser beams (each having a wavelength of 532 nm) having Nd:YVO$_4$ (wavelength 1,064 nm) and Nd:GdVO$_4$ (wavelength 1,064 nm) as laser crystals, the solid-state laser beams being subjected to second-harmonic conversion, a solid-state laser beam of GaN (wavelength 531 nm), an Ar ion laser beam (wavelength 515 nm), a gas laser beam such as a copper vapor laser beam (wavelength 511 nm), and a semi-conductor laser beam having ZnCdSe as an active layer. Further, the laser beam may be pulsed or a continuous wave.

Regarding the energy density of the first laser beam L1, although the absorptance of the photoelectric conversion layer 4 is varied depending on the wavelength of the laser beam, the first laser beam L1 is hardly absorbed by the transparent electrode layer 3, and hence the energy density of the first laser beam L1 can be set to be enough to remove the photoelectric conversion layer 4 and the back electrode layer 5. For example, in the case of the green laser beam having a wavelength of 532 nm, its energy density can be set to be 0.5 J/cm$^2$ or more.

The second laser beam L2 can be set to be a laser beam (infrared laser beam) having a wavelength included in an infrared wavelength region. As described above, most of the infrared laser beam passes through the transparent electrode layer 3, but a little of the infrared laser beam is absorbed by the transparent electrode layer 3. Therefore, by setting the energy density to be sufficiently high, it is possible to apply to the transparent electrode layer 3 energy enough to remove the transparent electrode layer 3.

Specifically, as the second laser beam L2, an infrared laser beam having a wavelength of 1,064 nm using an Nd:YAG crystal as a laser crystal may be used. The wavelength of the first laser beam L1 may be selected from an infrared wavelength region (700 nm to 2,500 nm) exhibiting a low optical absorptance with respect to the transparent electrode layer 3 and a high optical absorptance with respect to the photoelectric conversion layer 4, depending on the material for the transparent electrode layer 3. For such a laser beam, there are solid laser beams using Er:YAG (wavelength of 2940 nm), Ho:YAG (wavelength of 2,098 nm), Yb:YAG (wavelength of 1,030 nm), Nd:YVO$_4$ (wavelength of 1,064, 1,342 nm), Nd:GdVO$_4$ (wavelength of 1,063 nm), Ti-sapphire (wavelength of 700 to 1,000 nm), and the like as a laser crystal. In addition to them, a gas laser beam and a semi-conductor laser beam may be used as the first laser beam L1. Further, the laser beam may be pulsed or a continuous wave.

The energy density of the second laser beam L2 is appropriately selected within such a range that the transparent electrode layer 3 can be removed, although the absorptance of the transparent electrode layer 3 is varied depending on the wavelength of the laser beam. For example, in the case of the infrared laser beam having a wavelength of 1,064 nm, its energy density can be set to 5 J/cm$^2$ or more. The second laser beam L2 is not limited to be pulsed and may be a continuous wave.

During the irradiation of the second laser beam L2, the first region A1 does not include anymore the back electrode layer 5 (and the photoelectric conversion layer 4) that reflect the second laser beam L2 and contributes to accumulation of heat, and hence the accumulation of heat due to the irradiation of the second laser beam L2 does not occur, and generation of cracks in the transparent substrate 2 is prevented.

Further, by setting the second region A2 to be a region having a peripheral rim spaced from the first region A1, the end surface 4t and the end surface 5t that have been formed due to the first laser beam L1 are spaced from a position in which the transparent electrode layer 3 is to be removed. Accordingly, a shunt, which is generated due to the residues of the transparent electrode layer 3 removed by the second laser beam L2 that adhere to the end surfaces of the back electrode layer 5 and the photoelectric conversion layer 4, can be prevented.

As described above, in the edge deletion of this embodiment, by using the first laser beam L1 to remove the photoelectric conversion layer 4 and the back electrode layer 5 and the second laser beam L2 to remove the transparent electrode layer 3, it is possible to reduce heat to be applied to the transparent substrate 2 and to prevent generation of cracks. Further, the end surfaces 4t and 5t formed due to the first laser beam L1 and the end surface 3t formed due to the second laser beam L2 can be suppressed from being molten, adhesion of the residues of those end surfaces can be suppressed, and a shunt can be prevented.

As described above, the multilayer body 1 is subjected to edge deletion.

A laser beam irradiation apparatus 20 to be used in the edge deletion step (St2) will be described.

Figure 9:
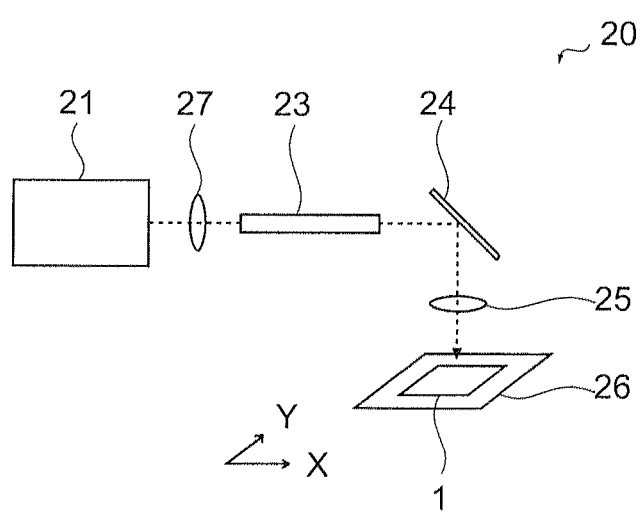
FIG. 9 is a view showing a schematic configuration of a laser beam irradiation apparatus according to a second embodiment.

FIG. 9 is a view showing a schematic configuration of the laser beam irradiation apparatus 20.

As shown in the drawing, the laser beam irradiation apparatus 20 includes an oscillator 21, a condenser lens 27, a homogenizer 23, a scanner 24, an fθ lens 25, and a stage 26. In the laser beam irradiation apparatus 20, the oscillator 21, the condenser lens 27, the homogenizer 23, the scanner 24, and the fθ lens 25 correspond to the laser beam oscillator. The configuration of the laser beam irradiation apparatus 20 is not limited to the configuration as described in the following.

The laser beam irradiation apparatus 20 includes the oscillator has a different configuration from that in the laser beam irradiation apparatus 10 according to the first embodiment. Further, the laser beam irradiation apparatus 20 does not include a variable attenuator. Hereinafter, different points from the laser beam irradiation apparatus 10 according to the first embodiment will be mainly described.

The oscillator 21 of the laser beam irradiation apparatus 20 according to this embodiment outputs a green laser beam which becomes the first laser beam L1 and an infrared laser beam which becomes the second laser beam L2. The oscillator 21 installs a laser crystal such as an Nd:YAG laser rod, a laser diode for photo-excitation, or the like. The oscillator 21 includes a non-linear crystal (not shown) that changes a laser beam (1,064 nm) generated from a laser crystal to a second harmonic wave (wavelength 532 nm). The oscillator 21 can be configured to be capable of switching the infrared laser beam and the green laser beam and output it.

The laser beam irradiation apparatus 20 according to this embodiment does not include the variable attenuator.

Unlike the laser beam irradiation apparatus 10 according to the first embodiment, it is unnecessary to control the output of the laser beam generated from the oscillator 21, and hence the variable attenuator can be omitted.

The configurations (the homogenizer 23, the scanner 24, the fθ lens 25, the stage 26) other than those configurations may be the same as the configurations as in the laser beam irradiation apparatus 10 according to the first embodiment.

One example of edge deletion by the laser beam irradiation apparatus 20 configured as described above will be described.

When the multilayer body 1 is disposed on the stage 26, the stage 26 moves to adjust the position of the multilayer body 1 so that any point on the peripheral rim portion 1a of the multilayer body 1 can be irradiated with a laser beam. The oscillator 21 outputs an infrared laser beam having a wavelength of 532 nm and a predetermined output. The output laser beam is collected by the condenser lens 27 to the homogenizer 23. The laser beam is converted by the homogenizer 23 to have a 0.6 mm square-shaped laser cross-section and made to even.

The green laser beam is scanned by the scanner 24, corrected through the fθ lens 25, and radiated to the above-mentioned point of the multilayer body 1 as the first laser beam L1. By the position controller controlling the movement of the stage 26, the first region A1 being the region irradiated with the first laser beam L1 is formed within the peripheral rim portion 1a.

Next, by moving the stage 26, the position of the multilayer body 1 is adjusted so that any point on the first region A1 is irradiated with the laser beam. The oscillator 21 outputs an infrared laser beam having a wavelength of 1,064 nm and a predetermined output. The laser beam is converted by the homogenizer 23 to have a 0.6 mm square-shaped laser cross-section and made to even.

The infrared laser is scanned by the scanner 24, corrected through the fθ lens 25, and radiated to the above-mentioned point of the multilayer body as the second laser beam L2. When the position controller controls the movement of the stage 26, the second region A2 being the region irradiated with the second laser beam is formed within the first region A1.

For example, when performing edge deletion on one side of the multilayer body 1, as shown in FIG. 7, the position controller uses the scanner 24 to scan the first laser beam L1 on an end portion of the first region A1 on a center side of the multilayer body 1 by a predetermined distance from a scan start position in the X-axis direction. At the same time, the position controller moves it by a predetermined distance in the X-axis direction. After that, the scanner 24 moves an irradiation position of the first laser beam L1 by a distance equal to the width of the laser beam in an opposite direction to the center side of the substrate in the Y-axis direction. After that, the scanner 24 moves back to the scan start position in the X-axis direction and scans by a predetermined distance in the X-axis direction again. As described above, while using the scanner 24 and the position controller, the stage 26 is moved such that the irradiation position of the first laser beam L1 goes around the power generation portion 1b. Further, the stage 26 is moved while using a scan by the scanner 24 and the position controller such that similar to the first laser beam L1, the second laser beam L2 goes around the outer peripheral side. In this manner, the multilayer body 1 is subjected to edge deletion.

As described above, the edge deletion step St2 according to the second embodiment is implemented.

After that, the solar cell module is manufactured as in the method of manufacturing a solar cell module according to the first embodiment.

With the method of manufacturing a solar cell module according to this embodiment, in the edge deletion step St2, the transparent electrode layer 3, the photoelectric conversion layer 4, and the back electrode layer 5 in the peripheral rim portion 1a are removed, and hence the frame and these layers can be surely insulated. Further, the peripheral rims of the transparent substrate 2, the insulating layer 7, and the protective layer 8 are spaced from the transparent electrode layer 3, the photoelectric conversion layer 4, and the back electrode layer 5, and hence it is possible to prevent moisture and the like from infiltrating through the peripheral rims of the transparent substrate 2, the insulating layer 7, and the protective layer 8, resulting in low power generation performance.

Third Embodiment

A third embodiment of the present invention will be described.

Description of the same content as that of the first embodiment will be omitted.

The method of manufacturing a solar cell module according to this embodiment includes a multilayer body producing step (St1), an edge deletion step (St2), and a modularization step (St3). The multilayer body producing step (St1) and the modularization step (St3) are the same as in the method of manufacturing a solar cell module according to the first embodiment, and hence the description thereof will be omitted.

[Edge Deletion Step (St2)]

In the first embodiment and the second embodiment, after the irradiation of the multilayer body 1 with the first laser beam L1 by an amount of one substrate to be an irradiation target is completed, the irradiation of the second laser beam L2 is performed. Meanwhile, in the third embodiment, when the irradiation of the multilayer body 1 with the first laser beam L1 by an amount of one substrate to be an irradiation target is not completed, the irradiation of the second laser beam L2 is started. In this point, the edge deletion step of the third embodiment is different from the edge deletion step of the second embodiment.

As the first laser beam L1, an infrared laser beam having a wavelength of 1,064 nm with an Nd:YAG crystal as a laser crystal may be used. The wavelength of the first laser beam L1 may be selected from an infrared wavelength region (700 nm to 2,500 nm) exhibiting a low optical absorptance with respect to the transparent electrode layer 3 and a high optical absorptance with respect to the photoelectric conversion layer 4, depending on the materials for the transparent electrode layer 3 and the photoelectric conversion layer 4. The energy density of the first laser beam L1 is appropriately selected within such a range that the photoelectric conversion layer 4 and the back electrode layer 5 can be removed without removing the transparent electrode layer 3, although the transmittance of the transparent electrode layer 3 and the absorptance of the photoelectric conversion layer 4 are varied depending on the wavelength of the laser beam. For example, in the case of an infrared laser beam having a wavelength of 1,064 nm, its energy density can be set to range from 0.5 to 1.5 J/cm$^2$.

As the second laser beam L2, an infrared laser beam having a wavelength of 1,064 nm using an Nd:YAG crystal as a laser crystal may be used. The wavelength of the second laser beam L2 may be selected from an infrared wavelength region (700 nm to 2,500 nm) exhibiting a low optical absorptance with respect to the transparent electrode layer 3 and a high optical absorptance with respect to the photoelectric conversion layer 4, depending on the material for the transparent electrode layer 3. The energy density of the second laser beam L2 is appropriately selected within such a range that the transparent electrode layer 3 can be removed, although the absorptance of the transparent electrode layer 3 is varied depending on the wavelength of the laser beam. For example, in the case of an infrared laser beam having a wavelength of 1,064 nm, its energy density can be set to 5 J/cm$^2$ or more.

A laser beam irradiation apparatus 30 to be used in the edge deletion step (St2) will be described.

Figure 10:
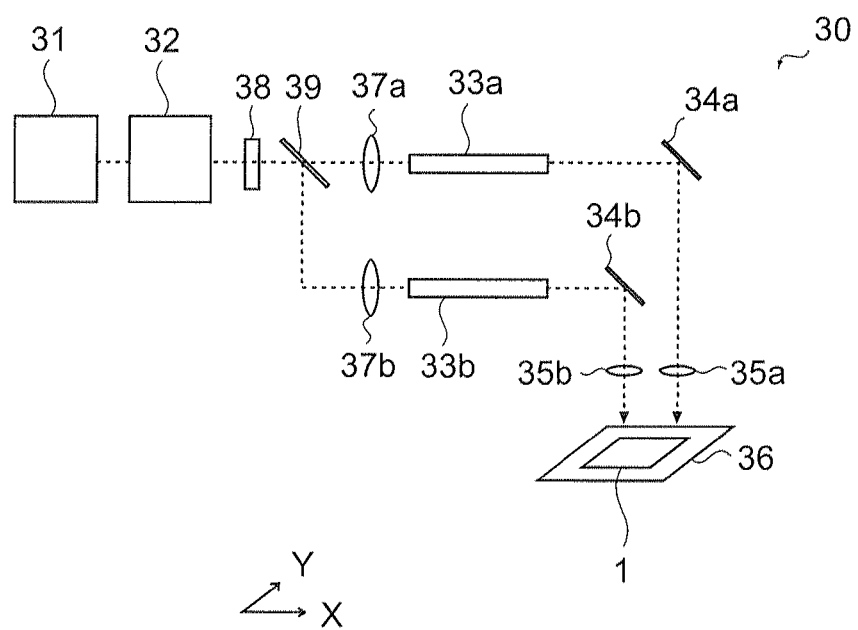
FIG. 10 is a view showing a schematic configuration of a laser beam irradiation apparatus according to a third embodiment.

FIG. 10 is a view showing a schematic configuration of the laser beam irradiation apparatus 30.

As shown in the drawing, the laser beam irradiation apparatus 30 includes an oscillator 31, a variable attenuator 32, a λ/2 wave plate 38, a polarizing beam splitter 39, condenser lenses 37a and 37b, homogenizers 33a and 33b, scanners 34a and 34b, fθ lenses 35a and 35b, and a stage 36. In the laser beam irradiation apparatus 30, the oscillator 31, the condenser lenses 37a and 37b, the homogenizers 33a and 33b, the scanners 34a and 34b, and the fθ lenses 35a and 35b correspond to the laser beam oscillator. The variable attenuator 32, the λ/2 wave plate 38, and the polarizing beam splitter 39 correspond to the output controller. The configuration of the laser beam irradiation apparatus 30 is not limited to the configuration as described in the following.

The oscillator 31 outputs an infrared laser beam which becomes a first laser beam L1 and a second laser beam L2, the infrared laser beam being a linear polarized beam. The oscillator 31 installs a laser crystal such as an Nd:YAG laser rod (not shown), a laser diode for photo-excitation, or the like. The oscillator 31 may include a mechanical or electrochemical Q-switch mechanism for pulsed oscillation. The oscillator 31 may output a laser beam being a linear polarized beam. Further, the oscillator 41 having an output of 500 W may be used.

The variable attenuator 32 attenuates the infrared laser beam output from the oscillator 31, to thereby control the output. The λ/2 wave plate 38 rotates the direction of polarization of the laser beam. The rotation of the λ/2 wave plate 38 can reverse the output rate of the laser beam to be sorted by the polarizing beam splitter 39 as will be described later. The polarizing beam splitter 39 allows one part of the laser beam which has passed through the λ/2 wave plate 38 to passes therethrough and reflects the other part. For example, the polarizing beam splitter 39 can allow 70% of the incident laser beam to pass therethrough and reflect 30% of the incident laser beam.

The laser beam which the polarizing beam splitter 39 has allowed to pass therethrough passes through a first laser beam path consisting of the condenser lens 37a, the homogenizer 33a, the scanner 34a, and the fθ lens 35a and is radiated to the multilayer body 1. Further, the laser beam which the polarizing beam splitter 39 has reflected passes through a second laser beam path consisting of the condenser lens 37b, the homogenizer 33b, the scanner 34b, and the fθ lens 35b and is radiated to the multilayer body 1. For example, in the case where the polarizing beam splitter 39 allows 30% of the incident laser beam to pass therethrough (reflects 70%), the laser beam which passes through the first laser beam path becomes a low-intensity laser beam and the laser beam which passes through the second laser beam path becomes a high-intensity laser beam. In this case, when the above-mentioned λ/2 wave plate 38 is rotated, the polarizing beam splitter is set to allow 70% of the incident laser beam (reflects 30%) to pass therethrough. As a result, the laser beam which passes through the first laser beam path becomes a high-intensity laser beam and the laser beam which passes through the second laser beam path becomes a low-intensity laser beam.

The condenser lens 37a collects the laser beam, which the polarizing beam splitter 39 has allowed to pass therethrough, to the homogenizer 33a and the condenser lens 37b collects the laser beams, which the polarizing beam splitter 39 has reflected, to the homogenizer 33b. The homogenizers 33a and 33b convert the incident laser beams into a square-shaped laser spot having an even light intensity distribution. The scanners 34a and 34b scans the laser beams by changing the direction of the reflected laser beams. The fθ lenses 35a and 35b correct the scanning speed and the laser spot shape of the laser beams scanned by the scanners 34a and 34b.

The stage 36 defines irradiation positions of the laser beams with respect to the multilayer body 1. The stage 36 is configured to be movable in an X-direction being one direction parallel to a surface (laser beam-irradiated surface) of the multilayer body 1 and a Y-direction orthogonal to the X-direction. The stage 36 freely allows the laser beams to be radiated onto an X-Y plane. The laser beam irradiation apparatus 30 includes a position controller (not shown) that controls the movement of the stage 36.

It should be noted that the laser beam irradiation apparatus 30 may include two oscillators 31 that generate the laser beams which respectively pass through the first laser beam path and the second laser path and two variable attenuators 32 that attenuate these laser beams. In the case where the laser beam irradiation apparatus 30 outputs a non-polarized laser beam, the polarizing beam splitter 39 is unnecessary.

One example of edge deletion performed by the non-polarized laser beam irradiation apparatus 30 configured as described above will be described.

When the multilayer body 1 is disposed on the stage 36, the stage 36 moves to adjust the position of the multilayer body 1 so that any point on the peripheral rim portion 1a of the multilayer body 1 can be irradiated with a laser beam which has passed through the first laser beam path and that one point on the peripheral rim portion 1a after irradiated with the low-intensity laser beam is irradiated with a laser beam which has passed through the second laser beam path. The oscillator 31 outputs an infrared laser beam having a wavelength of 1,064 nm and a predetermined output (e.g., 500 W) and the variable attenuator 32 controls the output. The infrared laser beam goes through the λ/2 wave plate 38 and passes through the polarizing beam splitter 39 or is reflected with the result that the infrared laser beam is separated into the first laser beam path and the second laser beam path. It should be noted that the λ/2 wave plate 38 is set to have a transmittance of 30% (reflectance 70%) and thus the laser beam which passes through the first laser beam path becomes a low-intensity laser and the laser beam which passes through the second laser beam path becomes a high-intensity laser beam. The low-intensity laser beam passes through the condenser lens 37a and the homogenizer 33a so as to be converted to have a 0.6 mm square-shaped laser cross-section and made to even. The high-intensity laser beam passes through the condenser lens 37b and the homogenizer 33b so as to be similarly converted and made to even.

The low-intensity laser beam is scanned by the scanner 34a and corrected through the fθ lens 35a. The high-intensity laser beam is scanned by the scanner 34b and corrected through the fθ lens 35b. The low-intensity laser beam is radiated to one point on the peripheral rim portion 1a. The high-intensity laser beam is radiated to one point on the peripheral rim portion 1a after irradiated with the low-intensity laser beam. The stage 36 moves and thus the laser beam is radiated to a predetermined range. Using the moving speed of the stage 36, the repeat frequencies of the low-intensity laser beam and the high-intensity laser beam are defined. Here, the low-intensity laser beam is adjusted to be a laser beam (first laser beam L1) having such an energy density that without removing the transparent electrode layer 3, the photoelectric conversion layer 4 and the back electrode layer 5 can be removed. The high-intensity laser beam is adjusted to be a laser beam (second laser beam L2) having such an energy density that the transparent electrode layer 3 can be removed. When the stage 36 is moved, following the first laser beam L1, the second laser beam L2 is radiated. In this case, the region to be irradiated with the second laser beam L2 is adjusted to be located within the region irradiated with the first laser beam. By the position controller controlling the movement of the stage 36, the first region A1 being the region irradiated with the first laser beam L1 is formed within the peripheral rim portion 1a and the second region A2 being the region irradiated with the second laser beam L2 is formed within the first region A1.

For example, when performing edge deletion on one side of the multilayer body 1, as shown in FIG. 7, the position controller uses the scanner 34a to scan the first laser beam L1 and the scanner 34b to scan the second laser beam L2 on an end portion of the first region A1 on a center side of the multilayer body 1 by a predetermined distance α from a scan start position S in an X-axis direction. When one scan is completed, the position controller moves the scan start position by a predetermined distance β in the X-axis direction. After that, the scanners 34a and 34b move irradiation positions of the first laser beam L1 and the second laser beam L2 by a distance equal to the width of the laser beam in an opposite direction to the center side of the substrate in a Y-axis direction. Thus, in the subsequent scan, the scanners 34a and 34b scan, in the X-axis direction again by a predetermined distance α from a position deviated by a predetermined distance β from the scan start position S in the X-axis direction and deviated by a distance equal to the width in the Y-axis direction of the laser beam from the scan start position S in the Y-axis direction. By repeating the process, when in the Y-axis direction, irradiations in a predetermined range are completed, the position controller moves the scan start positions of the laser beam L1 and the laser beam L2 by a predetermined distance a and a distance equal to the width in the X-axis direction of the laser beam from the above-mentioned scan start position S in the X-axis direction. As described above, while using the scanners 34a and 34b and the position controller, the stage 36 is moved such that the irradiation positions of the first laser beam L1 and the second laser beam L2 go around the power generation portion 1b. At this time, every time edge deletion of one side of the multilayer body 1 is completed, the stage 36 is moved or rotated. Here, the λ/2 wave plate 38 performs switching so that the second laser beam L2 is radiated from the scanner 34a or the first laser beam L1 is radiated from the scanner 34b. Thus, while moving the stage 36 in an opposite direction to the moving direction of the stage 36 before switching, the first laser beam L1 and the second laser beam L2 can be radiated to the multilayer body 1. Accordingly, as will be described in the following, the time required for moving or rotating the multilayer body 1 can be reduced and thus, the time required for edge deletion can be reduced.

A specific example of a method of moving the multilayer body 1 by the stage 36 will be described.

Figure 11:
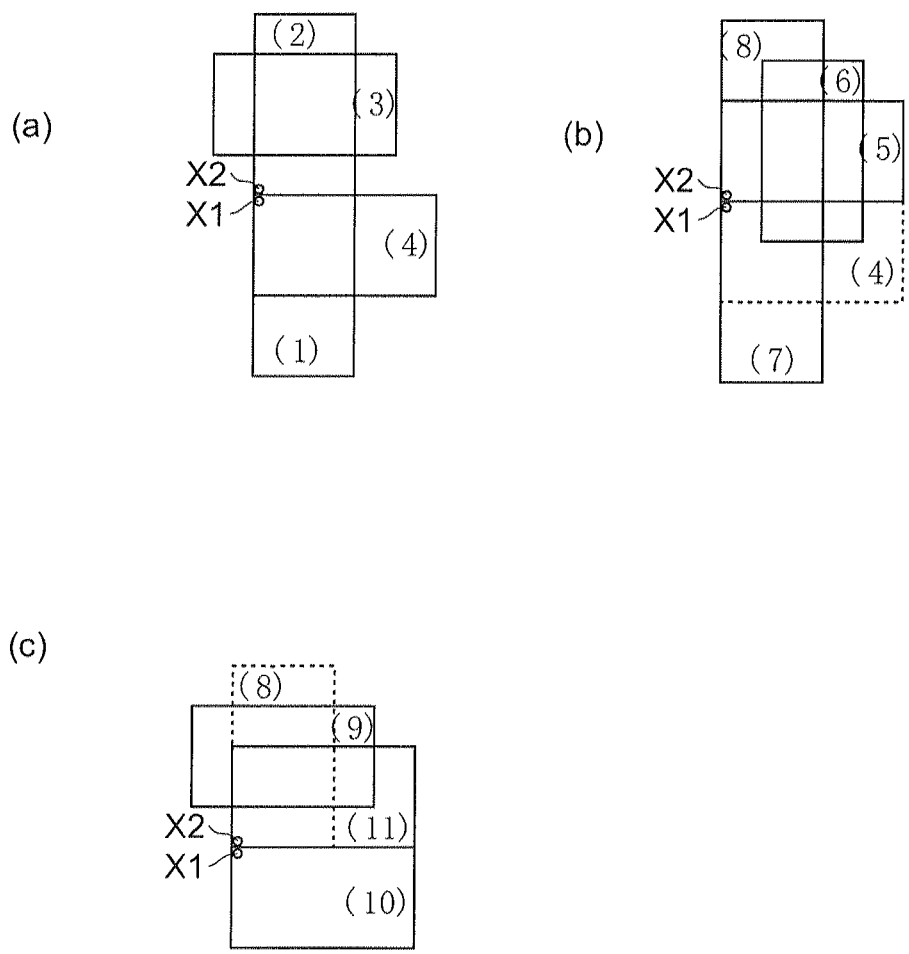
FIGS. 11(a)-11(c) are views showing moving paths for a substrate.

FIG. 11 is views showing moving paths for the multilayer body 1 in the case where laser beam paths through which a high-intensity laser beam and a low-intensity laser beam are output cannot be switched. It is assumed that the entire periphery (first to fourth sides) of the multilayer body 1 is subjected to edge deletion and that the position in which a laser beam is radiated is not changed. The X1 denotes an irradiation position of the first laser beam path and the X2 denotes an irradiation position of the second laser beam path. Here, in the irradiation position X1, the first laser beam L1 is radiated and in the irradiation position X2, the second laser beam L2 is radiated.

As shown in FIG. 11(a), the multilayer body 1 is originally located in the position (1). With the multilayer body 1 being irradiated with a laser beam (with a first laser beam L1 in the irradiation position X1 and with the second laser beam L2 in the irradiation position X2), the multilayer body 1 is moved by the stage 36 to the position (2). Thus, the first side of the multilayer body 1 is subjected to edge deletion. Next, when in the position (2), the stage 36 rotates 90 degrees to the right with the center of the multilayer body 1 being as a center of rotation, the multilayer body 1 takes the position (3). Due to the movement of the stage 36, the multilayer body 1 is moved from the position (3) to the position (4).

Subsequently, as shown in FIG. 11(b), with the multilayer body 1 being irradiated with a laser beam, the stage 36 moves to the position (5). Thus, the second side of the multilayer body 1 is subjected to edge deletion. Next, the multilayer body 1 is rotated by the stage 36 and takes the position (6). Next, the multilayer body 1 is moved by the stage 36 to the position (7). With the multilayer body 1 being irradiated with a laser beam, the multilayer body 1 is moved to the position (8). Thus, the third side of the multilayer body 1 is subjected to edge deletion.

Subsequently, as shown in FIG. 11(c), the multilayer body 1 is rotated by the stage 36 and takes the position (9). The multilayer body 1 is moved by the stage 36 to the position (10). With the multilayer body 1 being irradiated with a laser beam, the multilayer body 1 is moved to the position (11). Thus, the fourth side of the multilayer body 1 is subjected to edge deletion. Here, during the rotation from the position (2) to the position (3), the movement from the position (3) to the position (4), the rotation from the position (5) to the position (6), the movement from the position (6) to the position (7), the rotation from the position (8) to the position (9), and the movement from the position (9) to the position (10), edge deletion is not performed.

Figure 12:
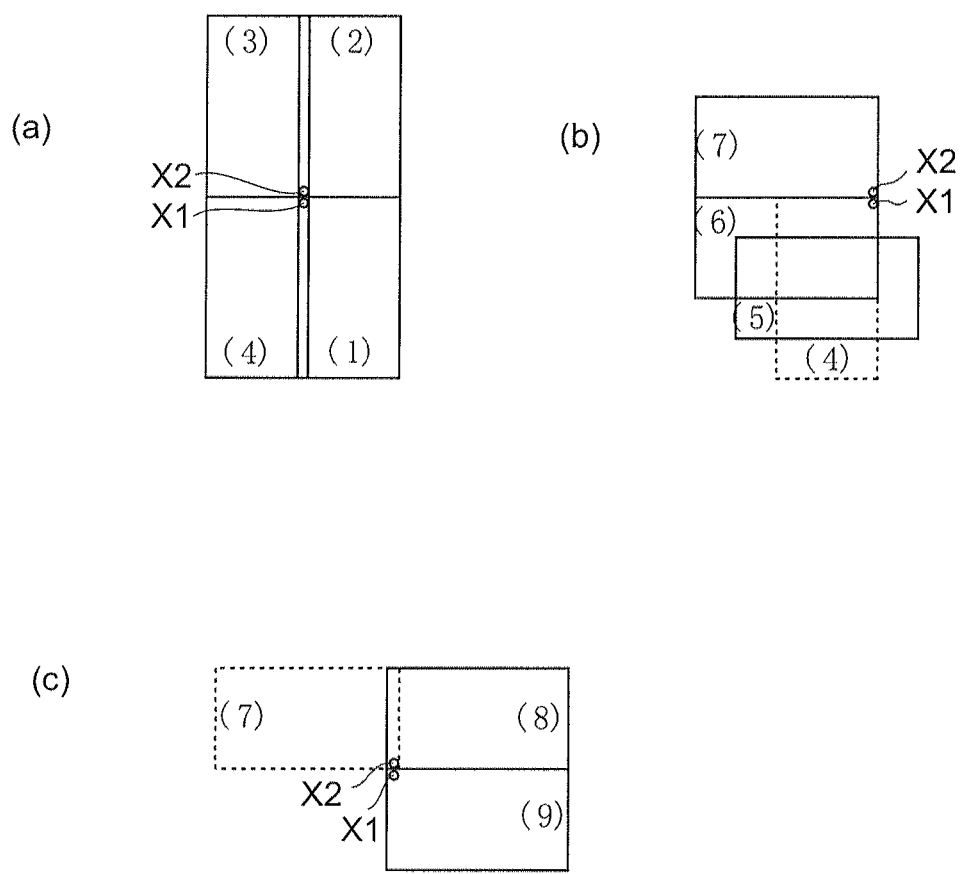
FIGS. 12(a)-12(c) are views showing moving paths for a substrate.

On the other hand, FIG. 12 is views showing moving paths for the multilayer body 1 in the case where laser beam paths through which a high-intensity laser beam and a low-intensity laser beam are output can be switched. It is assumed that the entire periphery (first to fourth sides) of the multilayer body 1 is subjected to edge deletion and that the position in which a laser beam is irradiated is not changed. The X1 denotes the irradiation position of the first laser beam L1 and the X2 denotes the irradiation position of the second laser beam L2. Here, in the irradiation position X1, the first laser beam L1 is radiated and in the irradiation position X2, the second laser beam L2 is radiated. Further, when the low-intensity laser beam and the high-intensity laser beam are switched, in the irradiation position X1, the second laser beam L2 is radiated and in the irradiation position X2, the first laser beam L2 is radiated.

As shown in FIG. 12(a), the multilayer body i is originally located in the position (1). With the multilayer body 1 being irradiated with a laser beam (with a first laser beam L1 in the irradiation position X1 and with the second laser beam L2 in the irradiation position X2), the multilayer body 1 is moved by the stage 36 to the position (2). The first side of the multilayer body 1 is subjected to edge deletion. Next, the multilayer body 1 is moved by the stage 36 to the position (3)

and the low-intensity laser beam and the high-intensity laser beam are switched. With the multilayer body 1 being irradiated with a laser beam (with a first laser beam in the irradiation position X2 and with a second laser beam in the irradiation position X1), the multilayer body 1 is moved by the stage 36 from the position (3) to the position (4). Thus, the second side of the multilayer body 1 is subjected to edge deletion.

Subsequently, as shown in FIG. 12(b), the multilayer body 1 is rotated by the stage 36, takes the position (5), and is moved to the position (6). Here, the low-intensity laser beam and the high-intensity laser beam are switched again. With the multilayer body 1 being irradiated with a laser beam (with a first laser beam L1 in the irradiation position X1 and with a second laser beam L2 in the irradiation position X2), the multilayer body 1 is moved by the stage 36 from the position (6) to the position (7). Thus, the third side of the multilayer body 1 is subjected to edge deletion.

Subsequently, as shown in FIG. 12(c), the multilayer body 1 is moved by the stage 36 to the position (8). Here, the low-intensity laser and the high-intensity laser are switched. With the multilayer body 1 being irradiated with a laser beam (with a first laser beam in the irradiation position X2 and with a second laser beam in the irradiation position X1), the multilayer body 1 is moved by the stage 36 from the position (8) to the position (9). Thus, during the fourth side of the multilayer body 1 is subjected to edge deletion. Here, during the movement from the position (2) to the position (3), the rotation from the position (4) to the position (5), the movement from the position (5) to the position (6), and the movement from the position (7) to the position (8), edge deletion is not performed.

As described above, in the case where the laser beam paths through which the high-intensity laser beam and the low-intensity laser beam are output cannot be switched, three movements and three rotations by the stage 36 are needed for edge deletion of the four sides of the multilayer body 1. In contrast, in the case where the laser beam paths through which the high-intensity laser beam and the low-intensity laser beam are output can be switched, by only three movements and one rotation by the stage 36, the four sides of the multilayer body 1 can be subjected to edge deletion. Thus, the takt time can be reduced.

In this manner, the multilayer body 1 is subjected to edge deletion.

With the method of manufacturing a solar cell module according to this embodiment, in the edge deletion step (St2), the multilayer body 1 can be irradiated with the first laser beam L1 and the second laser beam L2 at the same time. Therefore, in comparison with the case where the first laser beam L1 and the second laser beam L2 are individually radiated, the time required for the edge deletion step can be reduced.

Fourth Embodiment

A fourth embodiment of the present invention will be described.

Description of the same content as that of the first embodiment will be omitted.

The method of manufacturing a solar cell module according to this embodiment includes a multilayer body producing step (St1), an edge deletion step (St2), and a modularization step (St3). The multilayer body producing step (St1), the edge deletion step (St2), and the modularization step (St3) are the same as in the method of manufacturing a solar cell module according to the first embodiment, and hence the description thereof will be omitted.

[Edge Deletion Step (St2)]

As in the third embodiment, in the edge deletion step of the fourth embodiment, the first laser beam L1 and the second laser beam L2 are radiated at the same time.

As the first laser beam L1, an infrared laser beam having a wavelength of 1,064 nm using an Nd:YAG crystal as a laser crystal may be used. The wavelength of the first laser beam L1 may be selected from an infrared wavelength region (700 nm to 2,500 nm) exhibiting a low optical absorptance with respect to the transparent electrode layer 3 and a high optical absorptance with respect to the photoelectric conversion layer 4, depending on the materials for the transparent electrode layer 3 and the photoelectric conversion layer 4. The energy density of the first laser beam L1 is appropriately selected within such a range that the photoelectric conversion layer 4 and the back electrode layer 5 can be removed without removing the transparent electrode layer 3, although the transmittance of the transparent electrode layer 3 and the absorptance of the photoelectric conversion layer 4 are varied depending on the wavelength of the laser beam. For example, in the case of an infrared laser beam having a wavelength of 1,064 nm, its energy density can be set to range from 0.5 to 1.5 J/cm$^2$.

As the second laser beam L2, an infrared laser beam having a wavelength of 1,064 nm using an Nd:YAG crystal as a laser crystal may be used. The wavelength of the second laser beam L2 may be selected from an infrared wavelength region (700 nm to 2,500 nm) exhibiting a low optical absorptance with respect to the transparent electrode layer 3 and a high optical absorptance with respect to the photoelectric conversion layer 4, depending on the material for the transparent electrode layer 3. The energy density of the second laser beam L2 is appropriately selected within such a range that the transparent electrode layer 3 can be removed, although the absorptance of the transparent electrode layer 3 is varied depending on the wavelength of the laser beam. For example, in the case of an infrared laser beam having a wavelength of 1,064 nm, its energy density can be set to 5 J/cm$^2$ or more.

A laser beam irradiation apparatus 40 to be used in the edge deletion step (St2) will be described.

Figure 13:
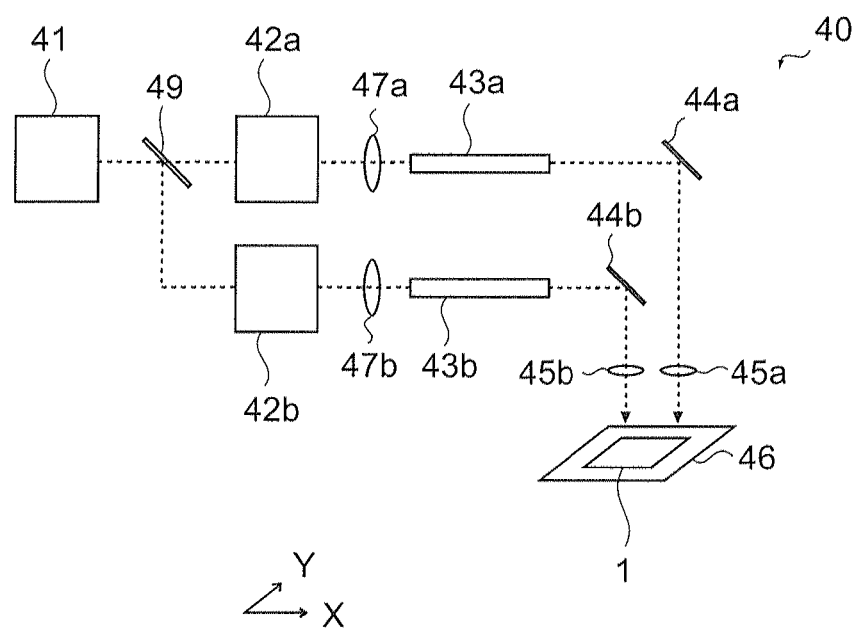
FIG. 13 is a view showing a schematic configuration of a laser beam irradiation apparatus according to a fourth embodiment.

FIG. 13 is a view showing a schematic configuration of the laser beam irradiation apparatus 40.

As shown in the drawing, the laser beam irradiation apparatus 40 includes an oscillator 41, a non-polarizing beam splitter 49, variable attenuators 42a and 42b, condenser lenses 47a and 47b, homogenizers 43a and 43b, scanners 44a and 44b, fθ lenses 45a and 45b, and a stage 46. In the laser beam irradiation apparatus 40, the oscillator 41, the non-polarizing beam splitter 49, the condenser lenses 47a and 47b, the homogenizers 43a and 43b, the scanners 44a and 44b, and the fθ lenses 45a and 45b correspond to the laser beam oscillator. The variable attenuators 42a and 42b correspond to the output controller. The configuration of the laser beam irradiation apparatus 40 is not limited to the configuration as described in the following.

The oscillator 41 outputs an infrared laser beam which becomes a first laser beam L1 and a second laser beam L2. The oscillator 41 installs a laser crystal such as an Nd:YAG laser rod (not shown), a laser diode for photo-excitation, or the like. The oscillator 31 may include a mechanical or electrochemical Q-switch mechanism for pulsed oscillation. The oscillator 41 may output a laser beam being a non-polarized beam. Further, the oscillator 41 having an output of 800 W may be used.

The non-polarizing beam splitter 49 allows one part of the laser beam output from the oscillator 41 to pass therethrough and reflects the other part. For example, the non-polarizing beam splitter may be set to allow 50% of the incident laser beam to pass therethrough and reflect 50% of the incident laser beam. The laser beam which the non-polarizing beam splitter 49 has allowed to pass therethrough passes through a first laser beam path consisting of the variable attenuator 42a, the condenser lens 47a, the homogenizer 43a, the scanner 44a, and the fθ lens 45a and is radiated to the multilayer body 1. Further, the laser beam which the non-polarizing beam splitter 49 has reflected passes through a second laser beam path consisting of the condenser lens 47b, the homogenizer 43b, the scanner 44b, and the fθ lens 45b and is radiated to the multilayer body 1.

The variable attenuator 42a is provided on the first laser beam path to attenuate an incident infrared laser beam, to thereby control the output. The variable attenuator 42b is provided on the second laser beam path to attenuate an incident infrared laser beam, to thereby control the output. By setting the attenuation rate of the variable attenuator 42a to be larger than the attenuation rate of the variable attenuator 42b, the laser beam which passes through the first laser beam path becomes a low-intensity laser beam and the laser beam which passes through the second laser beam path becomes a high-intensity laser beam.

The condenser lens 47a collects the incident laser beam to the homogenizer 43a and the condenser lens 47b collects the incident laser beam to the homogenizer 43b. The homogenizers 43a and 43b convert the incident laser beams into a square-shaped laser spot having an even light intensity distribution. The scanners 44a and 44b scan the incident laser beams by changing the direction of the reflected laser beams. The fθ lenses 45a and 45b correct the scanning speed and the laser spot shape of the laser beams scanned by the scanners 44a and 44b.

The stage 46 defines the irradiation positions of the laser beams with respect to the multilayer body 1. The stage 46 is configured to be movable in an X-direction being one direction parallel to a surface (laser beam-irradiated surface) of the multilayer body 1 and a Y-direction orthogonal to the X-direction. The stage 46 freely allows the laser beams to be radiated onto an X-Y plane. The laser beam irradiation apparatus 40 includes a position controller (not shown) that controls the movement of the stage 46.

One example of edge deletion performed by the laser beam irradiation apparatus 40 configured as described above will be described.

When the multilayer body 1 is disposed on the stage 46 and the stage 46 moves to adjust the position of the multilayer body 1 so that any point on the peripheral rim portion 1a of the multilayer body 1 can be irradiated with a laser beam which has passed through the first laser beam path and that one point on the peripheral rim portion 1a after irradiated with the low-intensity laser beam is irradiated with a laser beam which has passed through the second laser beam path. The oscillator 41 outputs an infrared laser beam having a wavelength of 1,064 nm and a predetermined output (e.g., 800 W). The infrared laser beam passes through the non-polarizing beam splitter 49 (transmittance of 50%) or reflected (reflectance of 50%), with the result that the infrared laser beam is separated into the first laser beam path and the second laser beam path. The laser beam separated into the first laser beam path is attenuated by the variable attenuator 42a to have a predetermined output density (e.g., 30%) and becomes a low-intensity laser beam. Further, the laser beam separated into the second laser beam path is attenuated by the variable attenuator 42b by an attenuation rate smaller than that of the variable attenuator 42a to have a predetermined output density (e.g., 70%) and becomes a high-intensity laser beam. The low-intensity laser beam passes through the condenser lens 47a and the homogenizer 43a so as to be converted to have a 0.6 mm square-shaped laser cross-section and made to even. The high-intensity laser beam passes through the condenser lens 47b and the homogenizer 43b so as to be similarly converted and made to even.

The low-intensity laser beam is scanned by the scanner 44a and corrected through the fθ lens 45a. The high-intensity laser beam is scanned by the scanner 44b and corrected through the fθ lens 45b. The low-intensity laser beam is radiated to one point on the peripheral rim portion 1a. The high-intensity laser beam is radiated to one point on the peripheral rim portion 1a after irradiated with the low-intensity laser beam. The stage 46 moves and thus the laser beam is radiated to a predetermined range. Using the moving speed of the stage 46, the repeat frequencies of the low-intensity laser beam and the high-intensity laser beam are defined. Here, the low-intensity laser beam is adjusted to be a laser beam (first laser beam L1) having such an energy density that without removing the transparent electrode layer 3, the photoelectric conversion layer 4 and the back electrode layer 5 can be removed. The high-intensity laser beam is adjusted to be a laser beam (second laser beam L2) having such an energy density that the transparent electrode layer 3 can be removed. When the stage 46 is moved, following the first laser beam L1, the second laser beam L2 is irradiated. In this case, the region to be irradiated with the second laser beam L2 is adjusted to be located within the region irradiated with the first laser beam. By the position controller controlling the movement of the stage 46, the first region A1 being the region irradiated with the first laser beam L1 is formed within the peripheral rim portion 1a and the second region A2 being the region irradiated with the second laser beam L2 is formed within the first region A1.

For example, when performing edge deletion on one side of the multilayer body 1, as shown in FIG. 7, the position controller uses the scanner 44a to scan the first laser beam L1 and the scanner 44b to scan the second laser beam L2 on an end portion of the first region A1 on a center side of the multilayer body 1 by a predetermined distance α from a scan start position S in an X-axis direction. When one scan is completed, the position controller moves the scan start position by a predetermined distance β in the X-axis direction. After that, the scanners 44a and 44b move the irradiation positions of the first laser beam L1 and the second laser beam L2 by a distance equal to the width of the laser beam in an opposite direction to the center side of the substrate in a Y-axis direction. Thus, in the subsequent scan, the scanners 44a and 44b scan, in the X-axis direction again by a predetermined distance α from a position deviated by a predetermined distance β from the scan start position S in the X-axis direction and deviated by a distance equal to the width in the Y-axis direction of the laser beam from the scan start position S in the Y-axis direction. As described above, while using the scanners 44a and 44b and the position controller, the stage 36 is moved such that the irradiation positions of the first laser beam L1 and the second laser beam L2 go around the power generation portion 1b. In this manner, the multilayer body 1 is subjected to edge deletion.

With the method of manufacturing a solar cell module according to this embodiment, in the edge deletion step (St2), the multilayer body 1 can be irradiated with the first laser beam L1 and the second laser beam L2 at the same time. Therefore, in comparison with the case where the first laser beam L1 and the second laser beam L2 are individually radiated, the time required for the edge deletion step can be reduced.

The present invention is not limited only to the above-mentioned embodiments and can be modified without departing from the gist of the present invention.

Although in each of the above-mentioned embodiments, the single laser beam irradiation apparatus is used, a plurality of laser beam irradiation apparatuses may be used at the same time in order to perform edge deletion. For example, if one laser beam irradiation apparatus is used for one side of a multilayer body in order to perform edge deletion, then in comparison with the case where four sides of the multilayer body 1 are subjected to edge deletion one by one, the edge deletion step can be completed for a shorter time.

Further, although in each of the above-mentioned embodiments, the positional relation between the irradiation position X1 of the first laser beam path and the irradiation position X2 of the second laser beam path is fixed, this relation may be variable. For example, if the irradiation position X2 of the second laser beam path is configured to be rotatable by 90 degrees with the irradiation position X1 of the first laser beam path being as the center, then the rotation of the multilayer body can be omitted.

The invention claimed is:

1. A method of manufacturing a solar cell module, comprising:
radiating a first laser beam to a multilayer body having opposite lateral ends, and which further includes a transparent substrate and a transparent electrode layer, a photoelectric conversion layer, and a back electrode layer sequentially formed on the transparent substrate, from a side of the transparent substrate, to thereby remove the photoelectric conversion layer and the back electrode layer entirely in a first region entirely irradiated with the first laser beam, the first region including a lateral end portion of the multilayer body that extends laterally to one of the lateral ends thereof; radiating a second laser beam having a property different from a property of the first laser beam into the first region such that the second laser beam is spaced from a peripheral rim of the first region, to thereby remove only the transparent electrode layer in a second region irradiated with the second laser beam.

2. The method of manufacturing a solar cell module according to claim 1, wherein
the first laser beam and the second laser beam have the same wavelength included in an infrared wavelength region, and
the second laser beam is radiated to have an energy density higher than an energy density of the first laser beam.

3. The method of manufacturing a solar cell module according to claim 1, wherein
the first laser beam has a wavelength included in a green light wavelength region, and
the second laser beam has a wavelength included in an infrared wavelength region.

4. The method of manufacturing a solar cell module according to claim 2, wherein
the second laser beam is radiated to the multilayer body from the side of the one transparent substrate.

5. The method of manufacturing a solar cell module according to claim 4, wherein
the second region is spaced laterally outward from the peripheral rim of the first region and extends laterally to the one lateral end of the multilayer body.

6. An apparatus of manufacturing a solar cell module, the apparatus radiating a laser beam to a multilayer body having opposite lateral ends and further including a transparent substrate and a transparent electrode layer, a photoelectric conversion layer, and a back electrode layer sequentially formed on the transparent substrate, the apparatus comprising:
a laser beam oscillator that generates a laser beam having a wavelength included in an infrared wavelength region;
an output controller that forms, in order to remove the photoelectric conversion layer and the back electrode layer, a first laser beam by controlling an output of the laser beam and that forms, in order to remove the transparent electrode layer, a second laser beam having an output larger than an output of the first laser beam by controlling the output of the laser beam;
a stage on which the multilayer body is disposed;
a position controller that controls a relative position between the laser beam oscillator and the stage such that a first region of the multilayer body is formed including a lateral end portion of the multilayer body that extends laterally from a first peripheral rim to one of the lateral ends of the multilayer body, and a second region of the multilayer body is formed that extends laterally from a second peripheral rim to the one lateral end of the multilayer body with the second peripheral rim of the second region being spaced laterally outward from the first peripheral rim of the first region, the first region having the photoelectric conversion layer and the back electrode layer entirely removed by irradiating the first region of the multilayer body with the first laser, the second region having only the transparent electrode layer removed by irradiating the second region of the multilayer body with the second laser beam.

* * * * *